(12) United States Patent
Uzoh et al.

(10) Patent No.: US 10,446,532 B2
(45) Date of Patent: Oct. 15, 2019

(54) SYSTEMS AND METHODS FOR EFFICIENT TRANSFER OF SEMICONDUCTOR ELEMENTS

(71) Applicant: INVENSAS BONDING TECHNOLOGIES, INC., San Jose, CA (US)

(72) Inventors: Cyprian Emeka Uzoh, San Jose, CA (US); Paul M. Enquist, Durham, NC (US); Gaius Gillman Fountain, Jr., Youngsville, NC (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/389,157

(22) Filed: Dec. 22, 2016

(65) Prior Publication Data

US 2017/0200711 A1 Jul. 13, 2017

Related U.S. Application Data

(60) Provisional application No. 62/278,354, filed on Jan. 13, 2016, provisional application No. 62/303,930, filed on Mar. 4, 2016.

(51) Int. Cl.
*H01L 21/683* (2006.01)
*H01L 25/00* (2006.01)
(Continued)

(52) U.S. Cl.
CPC .......... *H01L 25/50* (2013.01); *H01L 21/6836* (2013.01); *H01L 21/78* (2013.01);
(Continued)

(58) Field of Classification Search
CPC ....... H01L 21/78; H01L 21/683; H01L 21/50; H01L 21/768; H01L 21/76838;
(Continued)

(56) References Cited

U.S. PATENT DOCUMENTS 4,998,665 A 3/1991 Hayashi
5,019,673 A 5/1991 Juskey et al.
(Continued)

FOREIGN PATENT DOCUMENTS

JP 04-337694 11/1992
JP 2000-100679 4/2000
(Continued)

OTHER PUBLICATIONS

U.S. Appl. No. 15/159,649, filed May 19, 2016, Uzoh et al.
(Continued)

*Primary Examiner* — Chuong A Luu
(74) *Attorney, Agent, or Firm* — Knobbe, Martens, Olson & Bear, LLP

(57) ABSTRACT

Systems and methods for efficient transfer of elements are disclosed. A film which supports a plurality of diced integrated device dies can be provided. The plurality of diced integrated device dies can be disposed adjacent one another along a surface of the film. The film can be positioned adjacent the support structure such that the surface of the film faces a support surface of the support structure. The film can be selectively positioned laterally relative to the support structure such that a selected first die is aligned with a first location of the support structure. A force can be applied in a direction nonparallel to the surface of the film to cause the selected first die to be directly transferred from the film to the support structure.

23 Claims, 22 Drawing Sheets

(51) Int. Cl.
*H01L 21/78* (2006.01)
*H01L 21/66* (2006.01)
*H01L 25/10* (2006.01)

(52) U.S. Cl.
CPC ............ *H01L 22/14* (2013.01); *H01L 25/105* (2013.01); *H01L 2221/68327* (2013.01)

(58) Field of Classification Search
CPC ............... H01L 21/76898; H01L 21/20; H01L 21/2007; H01L 21/76251; H01L 21/187; H01L 21/6836
USPC .......................................................... 438/15
See application file for complete search history.

(56) References Cited

U.S. PATENT DOCUMENTS

| | | | |
|---|---|---|---|
| 5,087,585 | A | 2/1992 | Hayashi |
| 5,322,593 | A | 6/1994 | Hasegawa et al. |
| 5,956,605 | A | 9/1999 | Akram et al. |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,121,688 | A | 9/2000 | Akagawa |
| 6,265,775 | B1 | 7/2001 | Seyyedy |
| 6,374,770 | B1 | 4/2002 | Lee |
| 6,582,991 | B1 | 6/2003 | Maeda et al. |
| 6,887,769 | B2 | 5/2005 | Kellar et al. |
| 7,078,811 | B2 | 7/2006 | Suga |
| 7,102,524 | B2 | 9/2006 | Arneson et al. |
| 7,126,212 | B2 | 10/2006 | Enquist et al. |
| 7,354,798 | B2 | 4/2008 | Pogge et al. |
| 7,498,241 | B2 | 3/2009 | Maki et al. |
| 8,183,127 | B2 | 5/2012 | Patti et al. |
| 8,241,961 | B2 | 8/2012 | Kim et al. |
| 8,314,007 | B2 | 11/2012 | Vaufredaz |
| 8,476,146 | B2 | 7/2013 | Chen et al. |
| 8,841,002 | B2 | 9/2014 | Tong |
| 9,171,756 | B2 | 10/2015 | Enquist et al. |
| 9,184,125 | B2 | 11/2015 | Enquist et al. |
| 9,331,149 | B2 | 5/2016 | Tong et al. |
| 9,385,024 | B2 | 7/2016 | Tong et al. |
| 9,496,239 | B1 | 11/2016 | Edelstein et al. |
| 2002/0000328 | A1* | 1/2002 | Motomura ........... H05K 3/4614 174/255 |
| 2002/0003307 | A1 | 1/2002 | Suga |
| 2005/0040530 | A1 | 2/2005 | Shi |
| 2005/0153522 | A1 | 7/2005 | Hwang et al. |
| 2007/0158024 | A1 | 7/2007 | Addison et al. |
| 2008/0265421 | A1 | 10/2008 | Brunnbauer et al. |
| 2009/0068831 | A1 | 3/2009 | Enquist et al. |
| 2010/0123268 | A1 | 5/2010 | Menard |
| 2014/0154839 | A1 | 6/2014 | Ahn et al. |
| 2014/0299981 | A1* | 10/2014 | Goh ........................ H01L 21/78 257/712 |
| 2014/0370658 | A1* | 12/2014 | Tong ..................... B23K 20/02 438/107 |
| 2015/0179481 | A1 | 6/2015 | Lin |
| 2015/0340285 | A1* | 11/2015 | Enquist ............. H01L 21/76898 438/107 |
| 2017/0062366 | A1 | 3/2017 | Enquist |
| 2017/0179029 | A1 | 6/2017 | Enquist et al. |
| 2017/0338214 | A1 | 11/2017 | Uzoh et al. |
| 2018/0096931 | A1 | 4/2018 | Huang et al. |
| 2018/0174995 | A1 | 6/2018 | Wang et al. |
| 2018/0190580 | A1 | 7/2018 | Haba et al. |
| 2018/0190583 | A1 | 7/2018 | DeLaCruz et al. |
| 2018/0191047 | A1 | 7/2018 | Huang et al. |
| 2018/0226375 | A1 | 8/2018 | Enquist et al. |

FOREIGN PATENT DOCUMENTS

| | | |
|---|---|---|
| JP | 2001-102479 | 4/2001 |
| JP | 2002-353416 | 12/2002 |
| JP | 2004-193493 | 7/2004 |
| KR | 10-2001-0104643 | 11/2001 |
| WO | WO 2010/024678 A1 | 3/2010 |

OTHER PUBLICATIONS

U.S. Appl. No. 15/379,942, filed Dec. 15, 2016, Enquist et al.
U.S. Appl. No. 15/387,385, filed Dec. 21, 2016, Wang et al.
U.S. Appl. No. 15/395,197, filed Dec. 30, 2016, Huang et al.
U.S. Appl. No. 15/426,942, filed Feb. 7, 2017, DeLaCruz et al.
Amirfeiz et al., "Formation of silicon structures by plasma-activated wafer bonding," Journal of The Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.

(56) References Cited

OTHER PUBLICATIONS

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—Cu, Cu—Si, and Cu—SiO2 at low temperature," Proceedings—Electrochemical Society, 2003, vol. 19, pp. 239-247.

Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.

Matsuzawa et al., "Room-temperature interconnection of electroplated Au microbump by means of surface activated bonding method," Electornic Components and Technology Confererence, 2001, 51st Proceedings, IEEE, pp. 384-387.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Reiche et al., "The effect of a plasma pretreatment on the Si/Si bonding behaviouir," Electrochemical Society Proceedings, 1998, vol. 97-36, pp. 437-444.

Roberds et al., "Low temperature , in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Confererence, 51st Proceedings, 2001, IEEE, pp. 755-760.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Office Action for U.S. Appl. No. 15/159,649, dated Sep. 14, 2017, 9 pages.

International Search Report and Written Opinion dated Apr. 17, 2017, issued in International Application No. PCT/US2016/068577, 16 pages.

International Search Report and Written Opinion dated Sep. 22, 2017, issued in International Application No. PCT/US2017/029187, 20 pages.

U.S. Appl. No. 15/849,383, filed Dec. 20, 2017, Enquist et al.
U.S. Appl. No. 15/856,391, filed Dec. 28, 2017, Haba et al.
U.S. Appl. No. 15/940,273, filed Mar. 29, 2018, Huang et al.

* cited by examiner

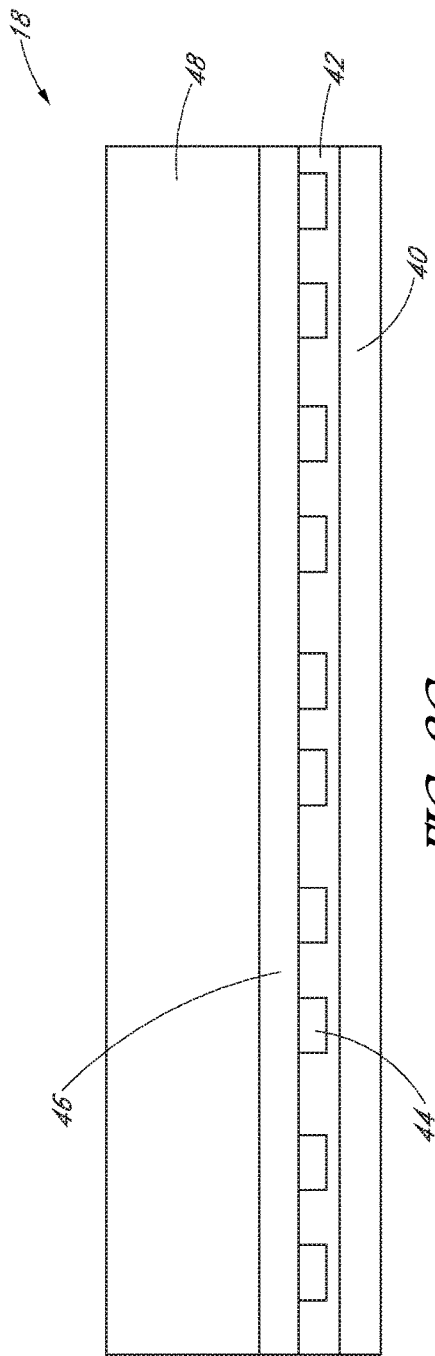
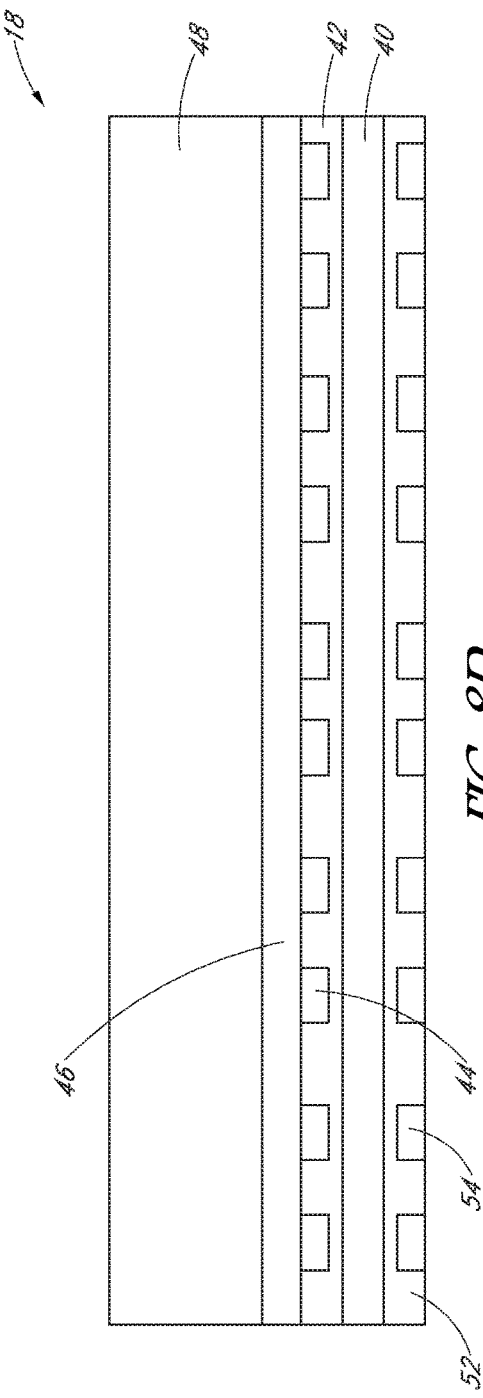

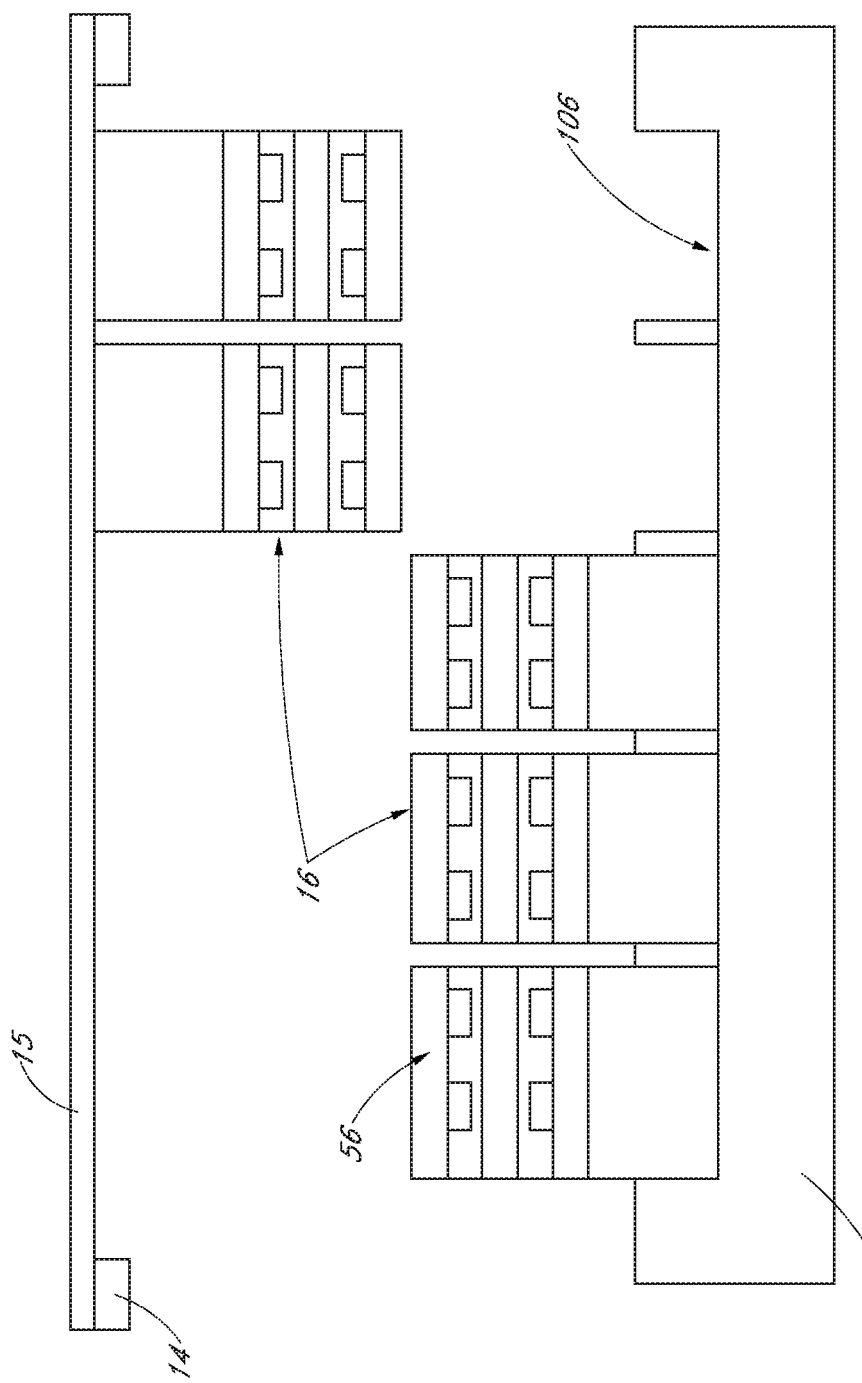

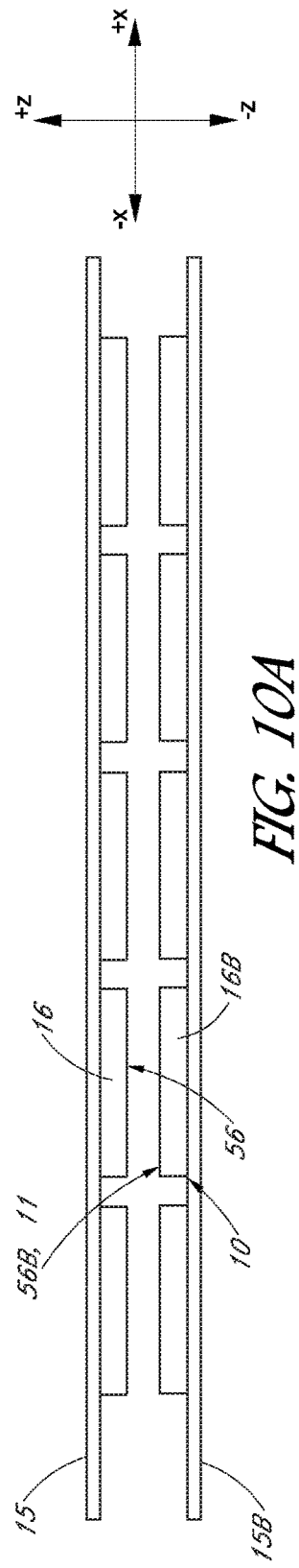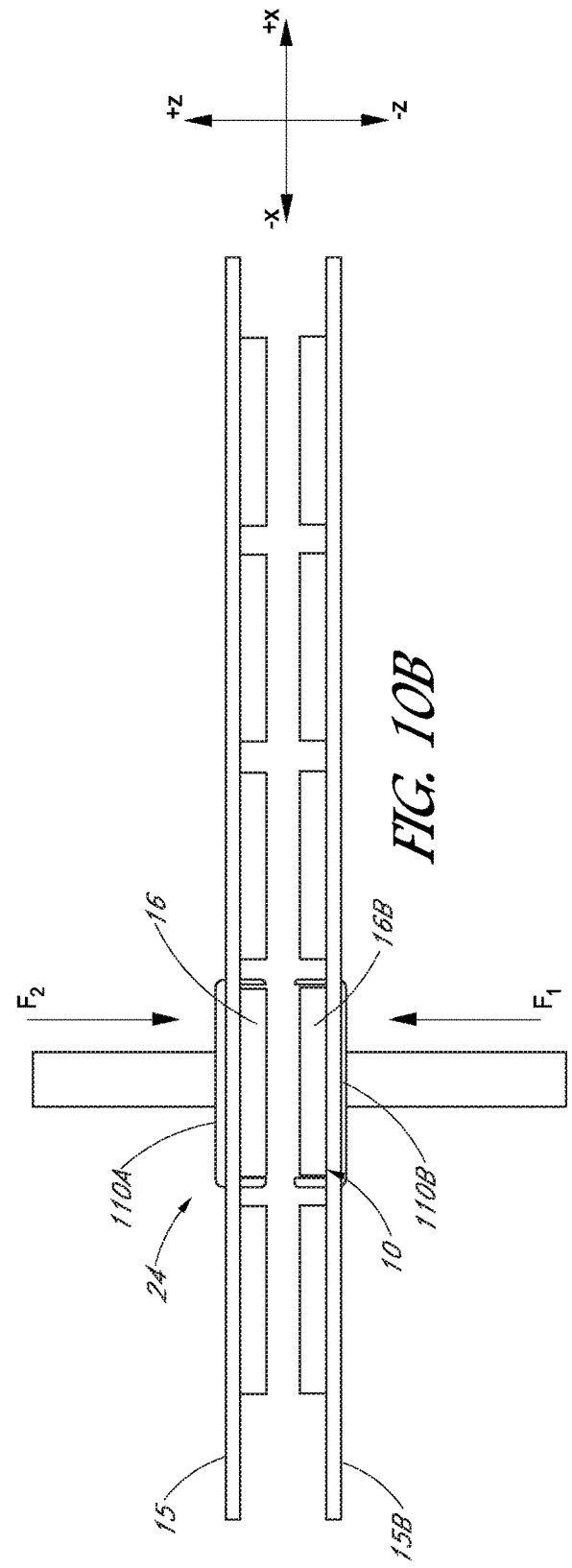

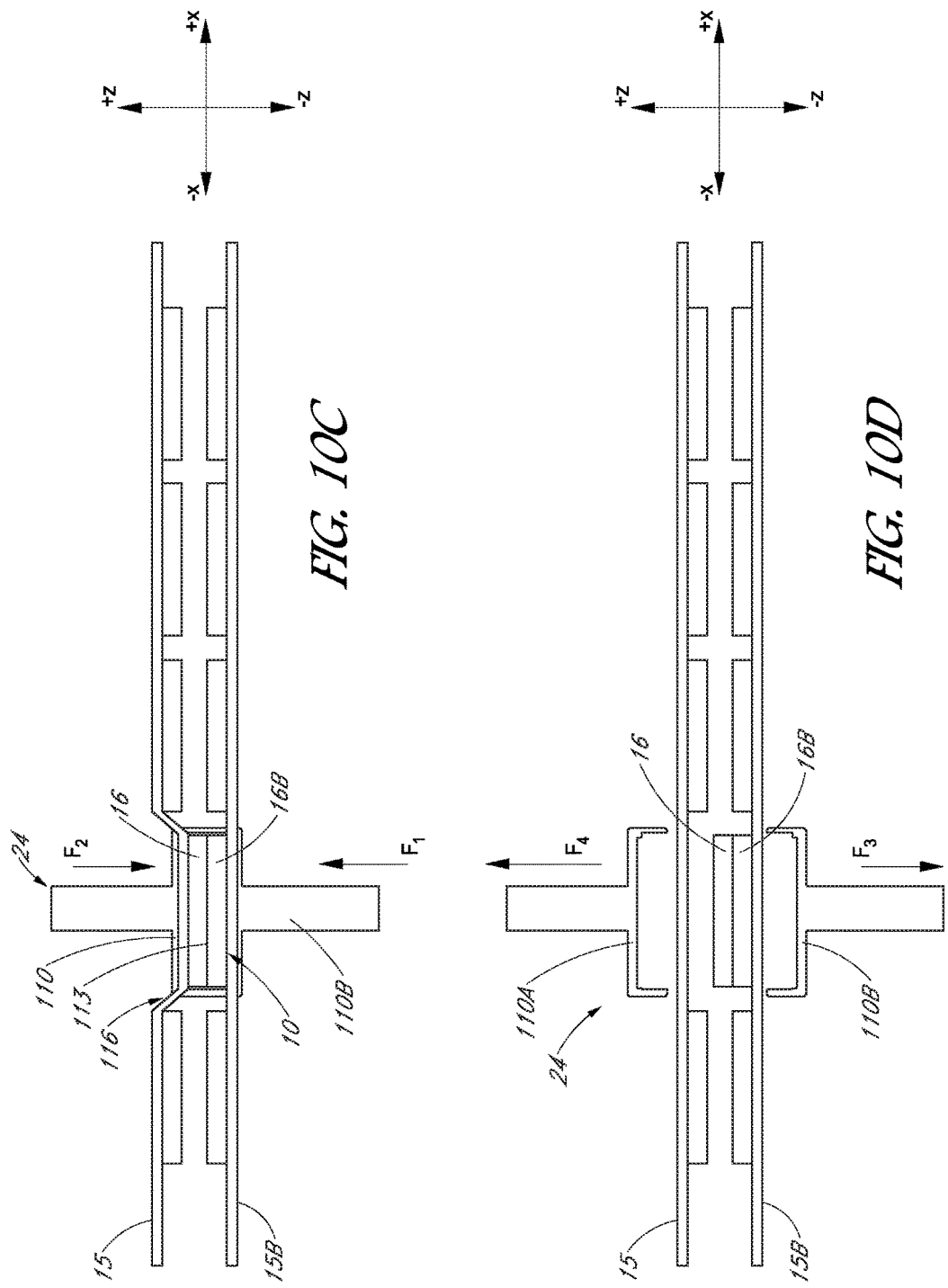

SYSTEMS AND METHODS FOR EFFICIENT TRANSFER OF SEMICONDUCTOR ELEMENTS

CROSS-REFERENCE TO RELATED APPLICATIONS

This application claims priority to U.S. Provisional Patent Application Nos. 62/278,354, filed Jan. 13, 2016, and 62/303,930, filed Mar. 4, 2016, the entire contents of each of which are hereby incorporated by reference herein in their entirety and for all purposes.

BACKGROUND

Field

The field relates generally to systems and methods for the efficient transfer of semiconductor elements to a support structure, and in particular, for the efficient transfer of integrated devices dies from a film to a support structure.

Description of the Related Art

Integrated device dies are typically built on a semiconductor wafer, which is placed on a film (e.g., a tape or other adhesive film) and diced to define a plurality of separate integrated device dies. In conventional semiconductor processes, the diced integrated device dies are removed individually from the dicing tape and placed onto an intermediate carrier, such as a die tray, waffle pack or other processing apparatus. For example, in some arrangements, a robotic arm is used to individually pick and place the dies from the die tray to the intermediate carrier. The device dies may undergo further processing and/or may be moved from the intermediate carrier to other processing stations, and ultimately to a packaging platform, such as a package substrate (e.g., printed circuit board, leadframe, etc.).

However, the use of robotic pick-and-place machines may be inefficient and time-consuming, as the end effector of the machine may take several seconds to individually remove each die from the dicing tape and place it on a particular location of the intermediate carrier. Moving dies one at a time using pick-and-place machines may therefore increase overall processing times and/or create a bottleneck in processing, which increases manufacturing costs. In some arrangements, a reel-to-reel tape machine may be used to move dies from a dicing tape to an intermediate carrier. However, reel-to-reel machines only move and array dies in one dimension (i.e., from one reel directly to another in a linear direction).

Accordingly, there remains a need for improved systems and methods for the efficient transfer of selected dies from a film to a support structure.

SUMMARY

In one embodiment, a method for mounting dies on a support structure is disclosed. The method can include providing a film which supports a plurality of singulated elements or integrated device dies, the plurality of singulated elements or integrated device dies disposed adjacent one another along a surface of the film. The method can comprise positioning the film adjacent the support structure such that the surface of the film faces a support surface of the support structure. The method can include selectively positioning the film laterally relative to the support structure such that a selected first element or die is aligned with a first location of the support structure. The method can include applying a force in a direction nonparallel to the surface of the film to cause the selected first die to be directly transferred from the film to the support structure.

In another embodiment, a method for bonding integrated device dies is disclosed. The method can include providing a film which supports a first plurality of singulated integrated device dies, the first plurality of singulated integrated device dies disposed adjacent one another along a first surface of the film. The method can include providing a support structure which supports a second plurality of integrated device dies, the second plurality of integrated device dies disposed adjacent one another along a second surface of the support structure. The method can also include positioning the film adjacent the support structure such that a selected first die from the first plurality of singulated integrated device dies or elements is aligned with and faces a second die from the second plurality of singulated integrated device dies. The method can include applying a force in a direction nonparallel to the first surface of the film to cause the first die to contact the second die. The method can include directly bonding the first die with the second die, or a first element with a second element. The method can also include removing the first die from the film.

The embodiments disclosed herein can be used to transfer any suitable type of element. The element can comprise a semiconductor element or an element that does not include a semiconductor material. For example, the elements may comprise a component that can be attached to a surface of a support structure for any suitable purpose, including electrical and/or non-electrical functions. Electrical circuits may be fabricated into, over, or around the element after attachment to the support structure. The singulated elements may comprise a plurality of singulated integrated device dies in some embodiments. The methods disclosed herein can further comprise selecting a first known good element (e.g., a first known good die) from the plurality of singulated elements, the first known good element having properly-functioning non-electrical characteristics, the selected first element comprising the first known good element.

In yet another embodiment, a semiconductor processing system is disclosed. The system can include a control system configured to select a first die from a plurality of singulated integrated device dies or element on a surface of a film which supports the plurality of singulated integrated device dies. The control system can be configured to send instructions to a movable apparatus to cause the movable apparatus to position the film adjacent a support structure such that the surface of the film faces a support surface of the support structure. The control system can be configured to send instructions to the movable apparatus to cause the movable apparatus to selectively position the film laterally relative to the support structure such that a selected first die is aligned with a first location of the support structure. The control system can be configured to send instructions to a die release assembly to cause the die release assembly to apply a force to at least one of the support structure and the film in a direction nonparallel to the surface of the film to cause the selected first die to be transferred from the film to the support structure.

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIG. 8C is a schematic side cross-sectional view of the substrate that is thinned to a desired thickness.

FIG. 8D is a schematic side cross-sectional view of the wafer with another nonconductive layer and another set of contacts formed on the polished backside of the wafer.

FIG. 8M is a schematic side cross-sectional view of dies that are transferred from a film to a waffle pack, according to various embodiments.

FIG. 8O is a schematic side cross-sectional view of dies after being flipped over into another waffle pack.

FIG. 10A is a schematic side view of various systems and methods for the efficient transfer of integrated device dies from a film to a support structure using a pair of cooperating collets.

FIG. 10B is a schematic side view of the system of FIG. 10A, with the collets being moved towards one another.

FIG. 10C is a schematic side view of the system of FIG. 10B, with the collets engaging the dies and film.

FIG. 10D is a schematic side view of the system of FIG. 10C after the collets are moved away from one another.

DETAILED DESCRIPTION

Figure 1:
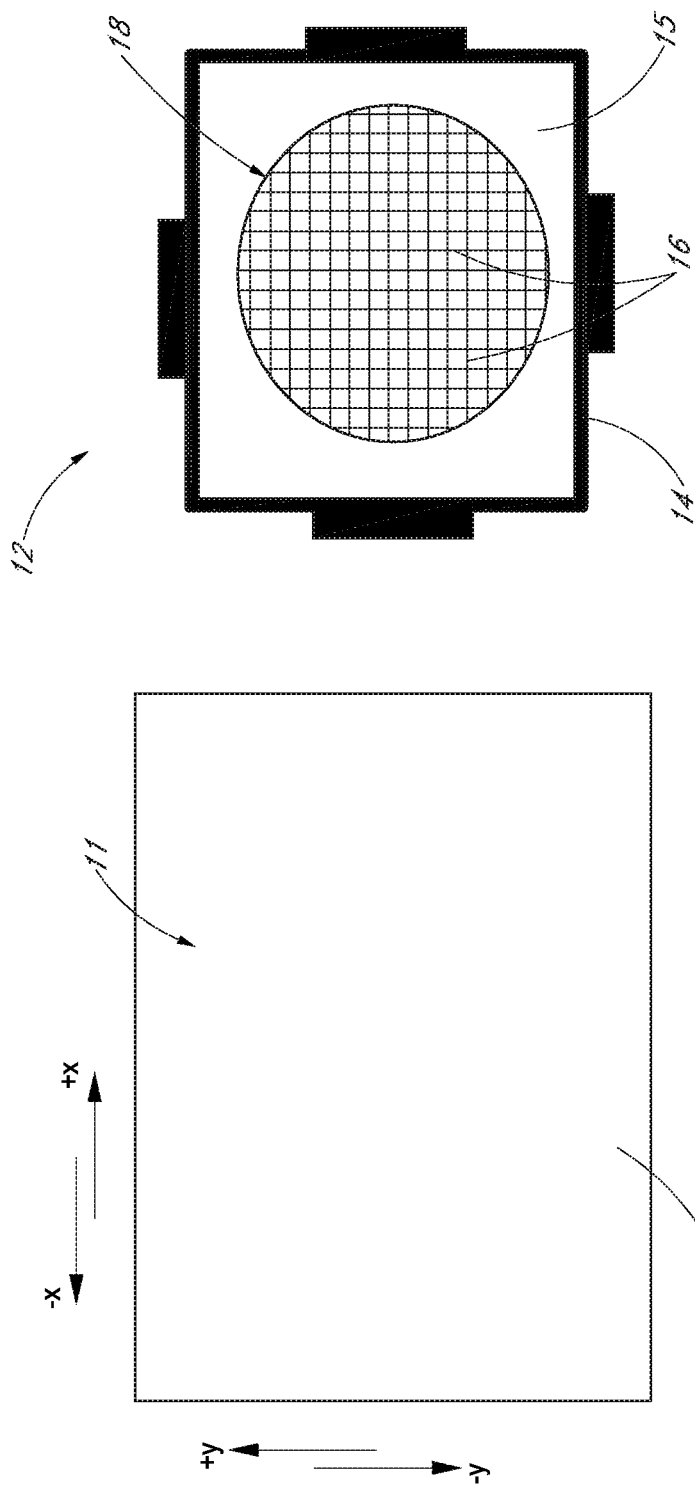
FIG. 1 is a schematic top plan view of a packaging support structure and a wafer mount, according to one embodiment.

Various embodiments disclosed herein relate to the efficient transfer of elements (e.g., semiconductor elements such as integrated device dies) from a film, such as an adhesive film or tape, to a support structure for packaging. As explained above, conventional systems may use pick-or-place machines to individually move elements or dies or other semiconductor elements to intermediate carriers with a robotic arm, and/or reel-to-reel tape systems. Such systems can be inefficient, leading to increased manufacturing costs. The embodiments disclosed herein advantageously improve the efficiency of transferring dies (or other types of elements or semiconductor elements) from dicing tape to a support structure for packaging. Moreover, the systems and methods described herein can identify known good dies (KGDs), which are dies that have been tested to confirm proper electrical functionality. The systems and methods disclosed herein can advantageously place selected dies at a desired location on a two-dimensional support surface using two-dimensional indexing and actuation.

For example, in various embodiments, a wafer comprising a plurality of elements (such as integrated device dies) can be diced or singulated on a dicing film, and KGDs (or other selected dies) of the wafer can be selectively transferred to a selected location on a two-dimensional support surface. In various arrangements, the dicing film can be stretched or maintained in tension when supporting the dies. In some embodiments, the KGDs or selected dies can be transferred directly from the dicing film to a packaging platform, which can comprise a package substrate (such as a printed circuit board, or PCB, leadframe, ceramic substrate, interposer etc.), another integrated device die (e.g., by way of stacking and direct bonding), an adhesive film for reconstitution of a wafer for packaging, a panel or any other suitable platforms. Advantageously, therefore, in various embodiments, there may be no intermediate carrier to transport the dies from the dicing film to subsequent processing stations and/or the packaging platform. Instead, selected singulated or diced integrated device dies or elements from a substrate or the wafer (such as KGDs) can be directly and selectively placed on the ultimate packaging platform from the dicing film without intervening structures, while unselected dies or elements can be left behind on the dicing film. Among other advantages, handling of the dies is minimized and surfaces can be prepared for direct bonding in a packaging structure (e.g., die stack) with fewer steps for protecting the prepared surface before bonding. In other embodiments, the selected singulated or diced integrated device dies (such as KGDs) can be selectively placed on an intermediate carrier (such as an adhesive sheet or tape), which can be employed for intervening packaging steps (e.g., molding for reconstituting a wafer for fan-out metallization) and/or subsequently mount the selected dies to the packaging platform.

The embodiments disclosed herein describe various ways to efficiently transfer integrated device dies to a packaging structure. However, it should be appreciated that the methods and systems disclosed herein can be used to efficiently transfer any suitable type of element (such as a semiconductor element, including integrated device dies, etc.) to a packaging structure. For example, the embodiments disclosed herein can be used to transfer semiconductor elements such as integrated device dies, interposers (e.g., semiconductor elements with integrated conductive traces or vias for transferring signals to and from other elements), reconstituted dies, etc. In some embodiments, other types of elements (which may or may not comprise a semiconductor material) can be transferred to a packaging structure. For example, the embodiments disclosed herein can transfer optical devices, such as lenses, filters, waveguides, etc. Moreover, in the embodiments disclosed herein, the elements (e.g., semiconductor elements) can be processed for direct bonding while mounted on the dicing film, such that most or all of the direct bonding processes can be conducted with the semiconductor elements mounted on the dicing film. Processing the elements for direct bonding on the dicing film can improve the overall efficiency of bonding, as intermediate transfer of the elements to other structures between singulation and direct bonding can thereby be avoided.

FIG. 1 is a schematic top plan view of a support structure or surface 10 and a wafer mount 12. The wafer mount 12 can comprise an assembly configured to support a semiconductor wafer 18 during various semiconductor processing techniques. For example, the wafer mount 12 can be configured to support the wafer 18 during a singulating or dicing operation. The wafer mount 12 can comprise a frame 14 and a film 15 mounted to the frame 14. The film 15 can comprise an adhesive sheet, e.g., a sheet of tape. The film 15 can be secured to the frame 14 about the periphery of the film 15 such that the film 15 is in tension. Although the frame 14 is illustrated as a polygonal frame in FIG. 1, it should be appreciated that the frame can take any suitable physical form that is configured to support the film 15.

The wafer 18 can comprise a semiconductor material (such as silicon or any other suitable Group elements) that is patterned with a plurality of integrated devices organized into multiple associated integrated device dies 16. For example, the wafer 18 may be patterned to define integrated circuits such as processors or memory, microelectromechanical systems (MEMS) device dies or any other suitable type of integrated device known to the skilled artisan. In addition, in some embodiments, each integrated device can be tested on the wafer 18 prior to singulating or dicing to identify which device dies 16 are electronically functional, referred to herein as known good dies (KGDs), and which device dies 16 are damaged or otherwise dysfunctional, and to generate a map locating KGDs. In other embodiments, electrical testing may be performed after singulating or dicing. Testing the electrical and/or electronic characteristics of the device dies 16 before the dies 16 are moved to the subsequent support structure 10 can advantageously reduce the amount of real estate on the support structure 10 which is used for dysfunctional or damage dies. Thus, in various embodiments disclosed herein, only KGDs may be selected and placed on the support structure 10, which can reduce manufacturing costs associated with processing and placing damaged or dysfunctional dies.

The wafer 18 can be mounted to the wafer mount 12 prior to singulating or dicing, such that the wafer 18 is adhered to an adhesive surface of the film 15. In some embodiments, the backside of the wafer can be mounted to an adhesive surface of the film 15. The wafer 18 can be diced or singulated using a suitable dicing or singulation technique to divide the wafer 18 into a plurality of separate, diced integrated device dies 16. For example, the wafer 18 can be sawed or otherwise singulated to create the individual dies 16. The dicing operation can be conducted such that only the wafer 18 is diced and the film 15 remains continuously connected (even though there may be saw or other marks on the film 15 as a result of the dicing operation) to support the dies 16. The intact film 15 can be used to keep the singulated dies 16 aggregated adjacent one another on an adhesive surface of the film 15. The film 15 and/or the singulated dies 16 can be cleaned using any suitable type of cleaning method. As explained above, although the wafer 18 of FIG. 1 includes integrated device dies 16 or element, in other embodiments, other types of semiconductor elements (such as interposers, reconstituted dies, etc.) may be provided on the wafer 18.

The support structure 10 can be any suitable structure or surface configured to support the diced integrated device dies 16 transferred from the wafer mount 12. For example, in the illustrated embodiment, the support structure 10 can comprise a support surface 11 coupled to, formed with, and/or mounted on a movable apparatus, such as a movable table. The support surface 11 can comprise a packaging platform, such as a package substrate (e.g., PCB, plastic, glass, leadframe, ceramic substrate, etc.), a wafer or stack of wafers, an interposer, a reconstituted wafer, panel, or reconstituted panel, or one or more other integrated device dies. As discussed in more detailed below with respect to FIGS. 8A-8L, the support surface to which the dies are transferred may be die or wafer surfaces prepared for direct bonding, without any intervening adhesive. In other embodiments, the support surface 11 and/or the support structure 10 may comprise an intermediate carrier, such as an adhesive sheet or mechanical die carrier, which can be used to transport the integrated device dies 16 to the ultimate packaging platform. In some embodiments, the support surface 11 may be an adhesive layer upon with a reconstituted wafer is formed, such that the relative positions of dies 16 and other packaging materials (e.g., mold or encapsulating material) are fixed on the support surface 11. In embodiments in which high die transfer rates are desirable, the support structure 10 and wafer mount 12 can move relative to each other.

As shown in FIG. 1, the support structure 10 and support surface 11 can be movable in two dimensions, i.e., movable in the +x, −x and +y, −y directions. A control system (see the control system 100 of FIGS. 5-6B) comprising one or more processors and associated memory devices can be configured to accurately and precisely control the movement of the support structure 10 in two dimensions. For example, the control system can be electrically coupled to a motor and gear system which can move or index the support structure 10 so as to align selected locations of the support surface 11 with selected integrated device dies 16 on the wafer mount 12.

Figure 2:
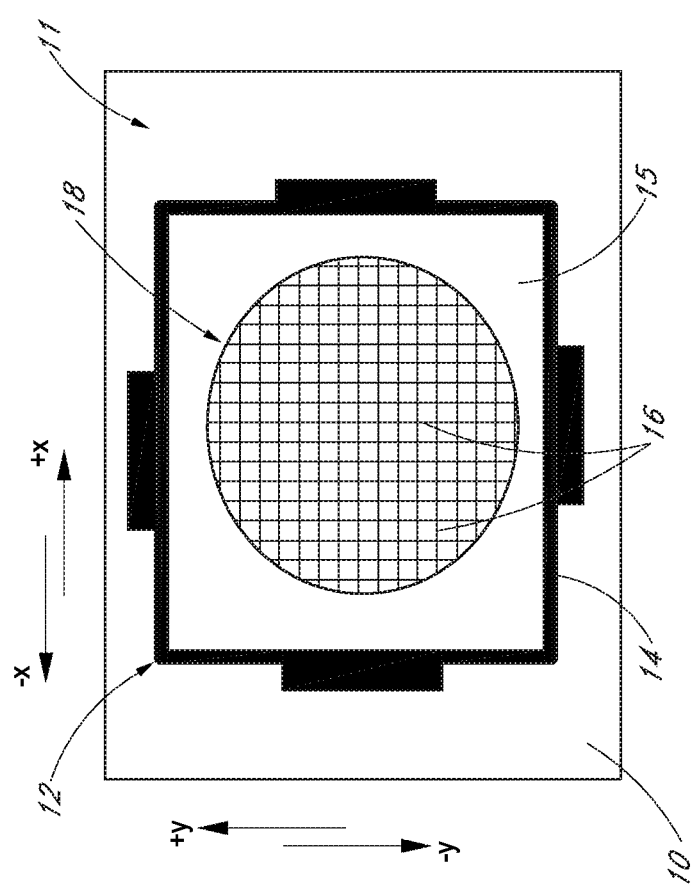
FIG. 2 is a top plan view of the wafer mount of FIG. 1 disposed vertically over the support surface of the support structure.

FIG. 2 is a top plan view of the wafer mount 12 of FIG. 1 disposed vertically over the support surface 11 of the support structure 10. In some embodiments, the wafer mount 12 with diced integrated device dies 16 can be positioned over the support surface 11 using any suitable mechanism, such as a robotic arm assembly. In some embodiments, such as that shown in FIG. 2, the wafer mount 12 with diced integrated device dies 16 may remain stationary, and the support structure 10 may be movable in two dimensions. In other embodiments, the support structure 10 may remain stationary, and the wafer mount 12 with dies 16 may be movable in two dimensions (i.e., the −x, +x and −y, +y directions). In still other embodiments, both the support structure 10 and the wafer mount 12 with diced die 16 may be movable in two dimensions. In the embodiment of FIG. 2, the support surface 10 and/or the wafer mount 12 may be moved vertically relative to one another such that the diced integrated device dies 16 are disposed in close proximity to the support surface 11 of the support structure 10. For example, the diced dies 16 can be spaced vertically from the support surface 11 by a distance in a range of 10 microns to 1000 microns, or more particularly, by a distance in a range of 10 microns to 100 microns. In addition, the support structure 10 may be moved laterally in two dimensions to align a desired location of the support surface 11 with a selected integrated device die 16. For example, the support structure 10 can be moved such that a selected KGD of the integrated device dies 16 (previously mapped after wafer-level testing) is aligned laterally (i.e., in the x and y directions) with the desired location of the support surface 11.

Figure 3:
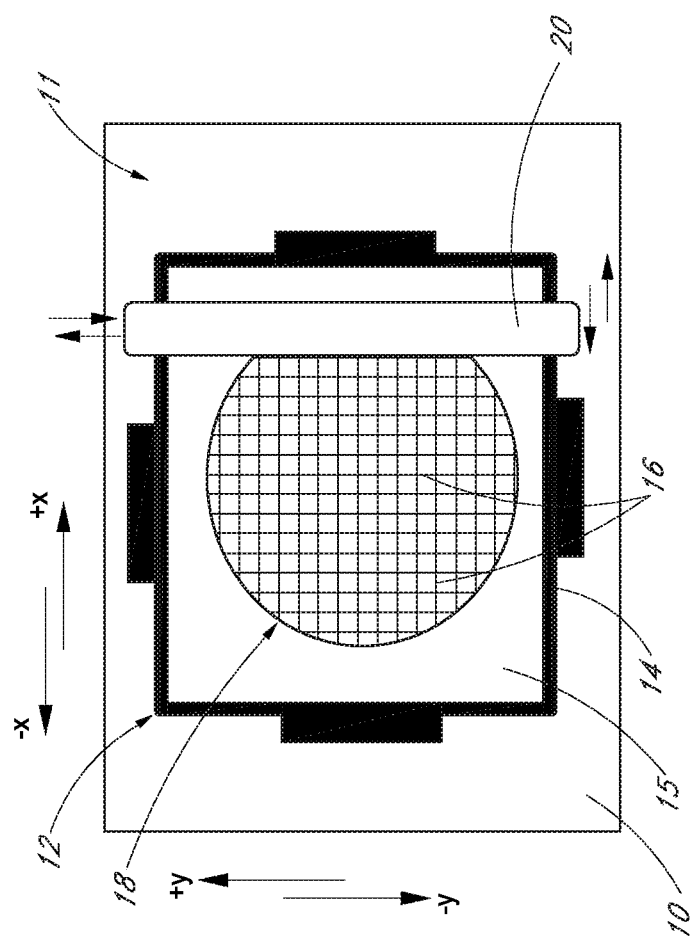
FIG. 3 is a top plan view of a die release assembly disposed over the wafer mount, according to some embodiments.

FIG. 3 is a top plan view of a die release assembly 20 disposed over the wafer mount 12, according to some embodiments. As shown in FIG. 3, the die release assembly 20 can be movable in two dimensions, i.e., the x and y directions, parallel to the surface of the film. The die release assembly 20 can be moved over a selected die from the plurality of diced dies 16. As explained in detail below in connection with FIGS. 5-6G, the die release assembly 20 can comprise one or more actuators (not shown in FIG. 3) configured to apply a force in a direction nonparallel to (e.g., perpendicular to) the adhesive surface of the film 15 to cause the selected die to be directly transferred to the support surface 11 of the support structure 10 from the film 15. In some embodiments, the die release assembly 20 can include one actuator to release a corresponding device die 16 from the film 15. In such an arrangement, the support structure 10 can be moved so as to position the selected die directly over a desired location on the support surface 11. The die release assembly 20 can be moved laterally (e.g., rotationally and/or linearly in the x and/or y directions) to be positioned over the selected device die. The actuator can be activated to cause the corresponding selected die to be transferred directly to the support surface 11.

In other embodiments, however, the die release assembly 20 can comprise an array of multiple actuators configured to cause multiple corresponding dies to be released from the film 15 and transferred to the support structure 10. For example, in some embodiments, the die release assembly 20 can comprise a linear array of N×1 actuators arranged in a line, where N is any suitable positive integer. In such an arrangement, the die release assembly 20 can be moved along the x direction to be positioned over one or more dies to be released from the die mount 12. In other arrangements, the die release assembly 20 can comprise a two-dimensional array of N×M actuators arranged so as to cause multiple dies across an area of the film 15 to be released. It should be appreciated that, in die release assemblies that have multiple actuators, the actuators can be activated together or individually. In some arrangements, all the actuators of the assembly 20 can be activated, e.g., simultaneously or sequentially (with or without intervening indexed motion). In other arrangements, only selected actuators of the assembly 20 can be activated simultaneously. For example, actuators of the assembly 20 which are disposed over KGDs (as determined from prior wafer-level testing and mapping) may be activated such that only KGDs are transferred to the support structure 10.

In some embodiments a trailing arm (not shown) similar to the die release assembly 20 may apply additional momentary pressure pneumatically to the KGD that is transferred to the support structure. Such additional momentary pressure may be particularly desirable for embodiments in which the support surface 11 comprises an adhesive material. For embodiments in which the support surface 11 comprises die or wafer surfaces prepared for direct bonding, without any intervening adhesive, the additional momentary pressure can be omitted, or if applied such pressure need not be high (e.g., less than or equal to about 2 atm), and may be applied for on the order of 1 millisecond to 1 second in view of prior preparation of surfaces for direct bonding. The additional pneumatically applied pressure may be applied to every die on the support structure 10 simultaneously in another supporting chamber with or without heat (not shown).

Figure 4:
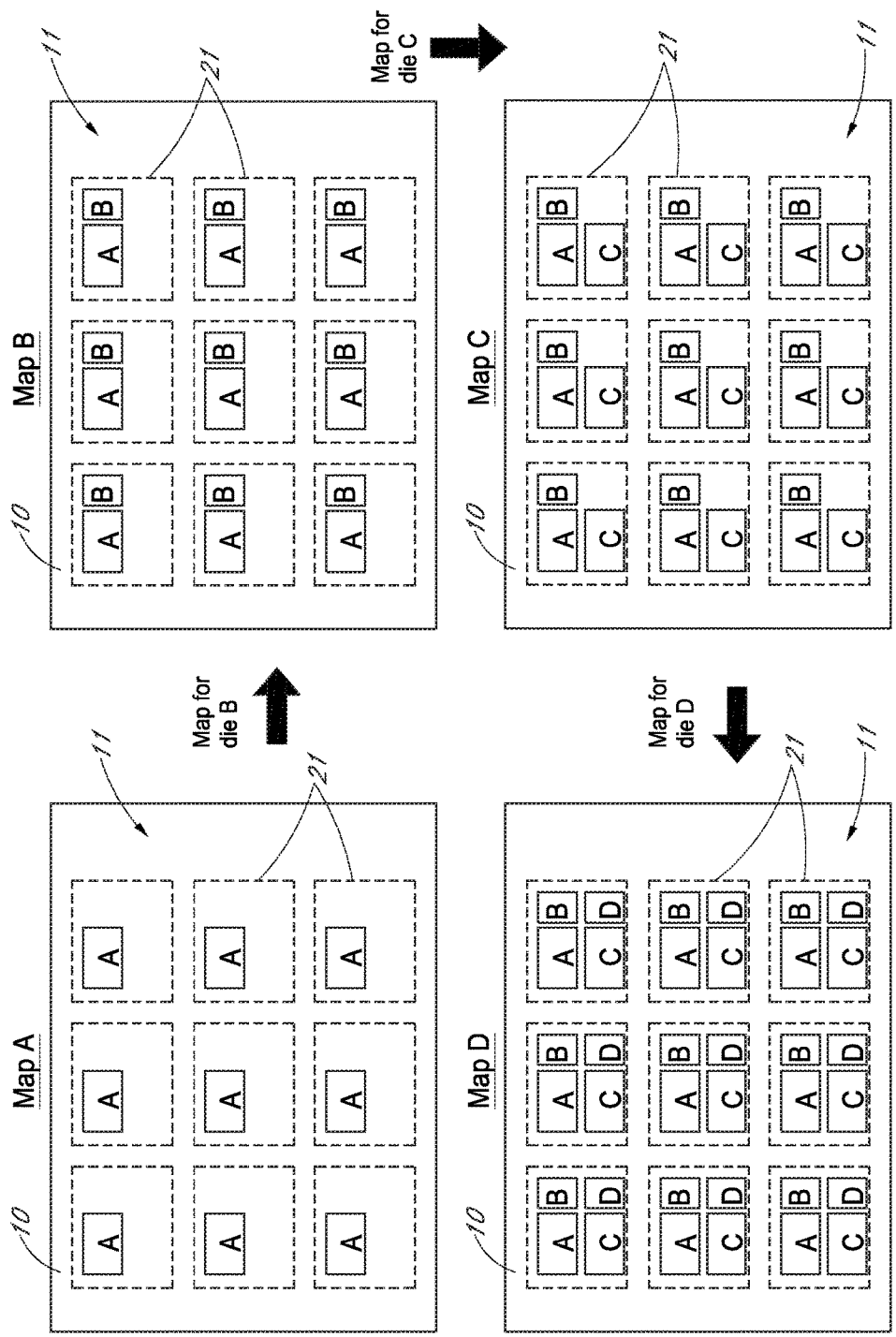
FIG. 4 is a top plan view of the support structure at various stages of a wafer-level packaging process.

FIG. 4 is a top plan view of the support structure 10 at various stages of a wafer-level packaging process. In the embodiment of FIG. 4, multiple dies A-D can be mounted within corresponding package regions 21 of the support structure 10. The corresponding package regions 21 may be associated with the components that are ultimately packaged together in an integrated device package. Advantageously, the components of each package can be assembled on the support structure 10, which may comprise a wafer or wafer stack, or an intermediate carrier such as an adhesive sheet or die carrier, directly from a first adhesive (e.g., wafer dicing tape). As shown in FIG. 4, Die A may be associated with Map A, which can identify locations on the support surface 11 at which Die A should be mounted. The control system (see the control system 100 of FIGS. 5-6B) can instruct the movable support structure 10 and/or the wafer mount 12 to move laterally relative to one another (e.g., rotationally and/or linearly in the x and/or y directions) such that Die A is laterally aligned with the identified location on Map A of the support surface 11. The die release assembly 20 can be activated to cause each Die A to be transferred to an identified location on the support surface 11. Thus, as shown in FIG. 4, each Die A can be mounted to a corresponding package region 21 in the upper left corner of the package region 21. In addition, as explained above, prior wafer-level die testing and mapping may confirm that each Die A is a known good die, or KGD, such that only KGDs are disposed within each package region 21.

The die release assembly 20 can move parallel to the surface of the film 15 to place additional dies on the support structure 10. The system can place each Die B at associated locations on the support surface 11 as indicated by Map B (i.e., at the upper right corner of each package region 21), each die C at associated locations on the support surface 11 as indicated by Map C (i.e., at the lower left corner of each package region 21), and each die D at associated locations on the support surface 11 as indicated by Map D (i.e., at the lower right corner of each package region 21). Thus, as shown in FIG. 4, each die A-D associated with a package can be mounted at the wafer level to an associated package region 21 of the support surface 11. In addition, each die A-D mounted to the package regions 21 can be KGDs, so as to improve the package yield, speed up the package assembly process, and reduce waste. The use of a movable support structure 10 for moving the support surface 11 relative to the wafer mount 12 (or vice versa) in two dimensions can advantageously enable the accurate placement of KGDs at a desired packaging location of the support structure 10.

As explained above, the support structure 10 can comprise any suitable structure. For example, in some embodiments, the support structure 10 comprises a packaging platform, such as a package substrate (e.g., PCB, plastic, glass, ceramic, lead frame, interposer, etc.). In some embodiments, the support structure 10 comprises a wafer or wafer stack, a die or die stack, or a reconstituted wafer. In still other embodiments, the support structure 10 comprises an intermediate carrier, such as an adhesive sheet, upon which further packaging steps can be taken (e.g., molding for forming a reconstituted wafer). Furthermore, although the embodiment of FIG. 4 illustrates several selected dies A-D being mounted side-by-side within corresponding package regions 21, in some embodiments, the selected dies (or some of the dies) may be stacked on top of one another, as will be clear from the example of FIGS. 8A-8L. One advantage of the disclosed embodiments is that binned devices with desired characteristic within the KGDs mapped on the wafer 18 can be selectively clustered at selected locations on the support structure 10. KGDs with lower performances can be clustered and segregated to other known locations on the support structure 10. However, such a clustering protocol may be more time consuming and expensive to implement as compared with dies that are mounted on a tape in a spool.

Figure 5:
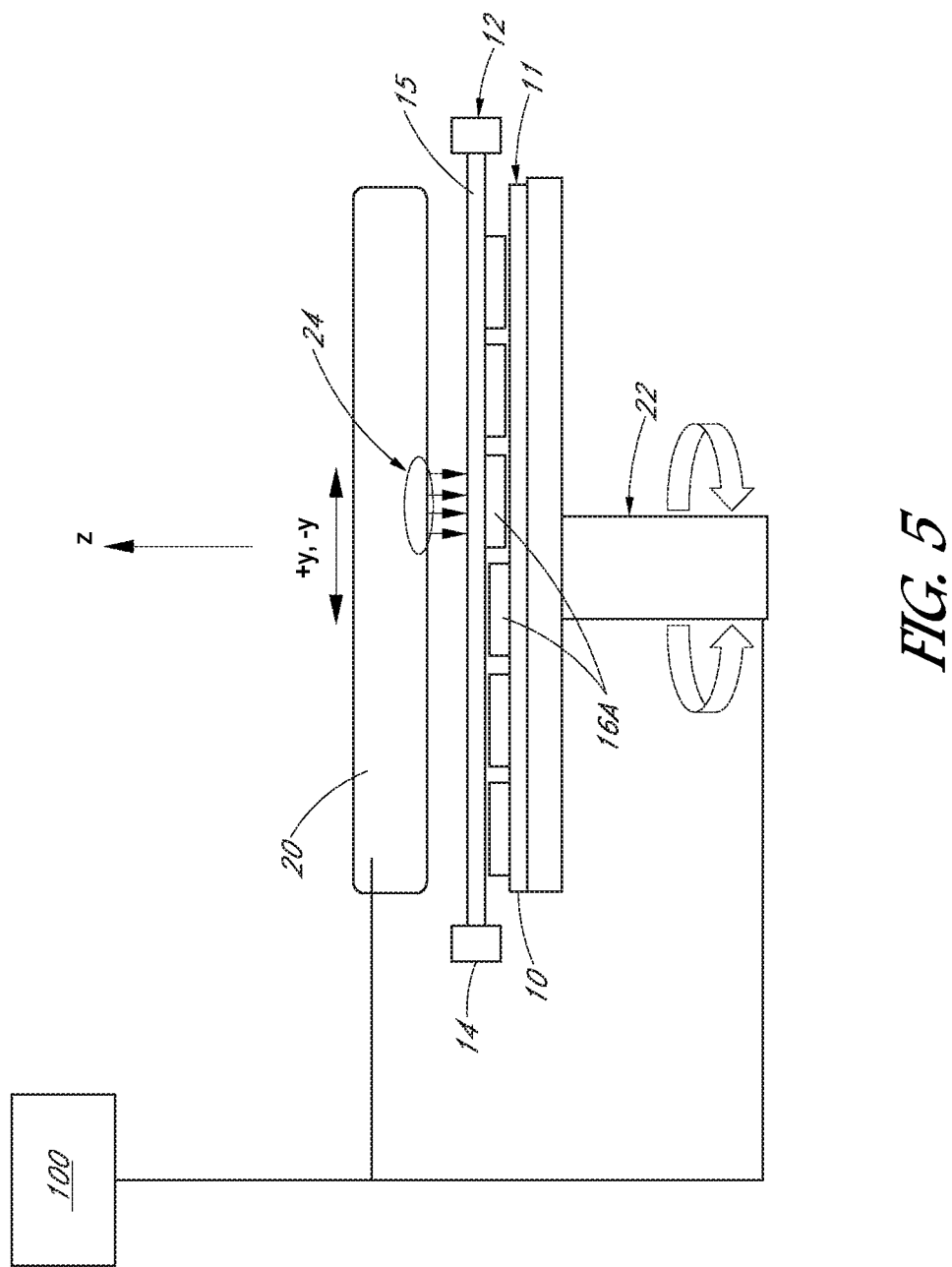
FIG. 5 is a schematic side view of a die release assembly comprising one or more fluid actuators disposed over and in close proximity to the wafer mount, according to various embodiments.

FIG. 5 is a schematic side view of a die release assembly 20 comprising one or more fluid actuators 24 disposed over and in close proximity to the wafer mount 12. The die release assembly 20 can be configured to apply a force to a backside of the film 15 directly opposite a selected die 16A to cause the selected die 16A to be transferred directly from the film 15 to the support surface 11. In various embodiments, the back side of the singulated dies may be exposed to a radiation source, such as an ultraviolet (UV) source, to weaken the adhesion between the die 16A and the dicing tape 15 prior to the transfer operation. For example, in the embodiment of FIG. 5, the fluid actuator 24 can comprise one or more nozzles which direct a high velocity fluid against the backside of the film 15. The high velocity fluid can cause the film 15 with the die 16A to flex away from the die release assembly 20 such that the die 16A contacts the support surface 11. The pressure applied by the high velocity fluid can also cause the die 16A to be released from the film 15 and transferred directly to the support surface 11. The nozzle(s) of the actuator 24 can be sized and shaped so as to apply a force to a localized region of the backside of the film 15 such that only the selected die is transferred from the film 15 to the support structure 10. In some embodiments, the fluid supplied by the fluid actuator 24 can comprise air or any other suitable gas, such as nitrogen. In other embodiments, the fluid may comprise a liquid such as water. In various embodiments, the fluid may be cooled or heated prior to or during the transfer of the die 16A to the support structure 10. For example, the fluid may be heated to a temperature above 50° C., e.g., in a range of 50° C. to 150° C. In some embodiments, heating the fluid may advantageously enhance the adhesion of the selected die 16A to the support surface 11 (e.g., directly bonding to another die) and/or may help delaminate or remove the die 16A from the film 15.

The support surface 11 may be disposed on any suitable type of movable platform, such as a movable table or support (see FIGS. 1-3 and attendant description). In the embodiment of FIG. 5, the support surface 11 is supported by a movable support 22 comprising a rotating chuck assembly, which is configured to rotate the support surface 11 about a z axis, which is perpendicular to the x and y directions. The movable support 22 can be moved (i.e., rotated) to accurately align a desired location on the support surface 11 (e.g., a desired location within a particular package region 21 as explained in FIG. 4) with a selected die 16A. When the die 16A is aligned with the desired location on the support surface 11, the fluid actuator 24 can be activated to cause the die 16A to be transferred from the film 15 to the support surface 11. Although the die release assembly 20 uses fluid actuators 24 to cause the dies to be released from the film 15 and transferred to the support surface 11, in other embodiments, such as those described below in connection with FIG. 8I, the die release assembly 20 can comprise a plunger or other type of mechanical device which can apply a force in a direction nonparallel to the film. Other non-mechanical or non-contact approaches, such as magnetic devices, sonic devices or radiation devices, can be used to apply a force in a direction nonparallel to the film to transfer the die 16A to the support structure 10. For example in one embodiment a radiation device such as a laser source may be used to debond the die 16A from the film 15 in a direction nonparallel to the film. Also heat from the radiation source may improve the attachment and the adhesion of the die 16A to the surface of the support structure 10.

As explained above, a control system 100 can be programmed to control the operation of the movable support 22 (and thereby the support structure 10 and support surface 11) and/or the operation of the die release assembly 20. For example, the control system 100 can comprise one or more processors and memory devices which are programmed with software that, when executed, sends instructions to a motor (or other device) which causes the movable support 22 to rotate to a desired orientation. Furthermore, the control system 100 may store in memory information regarding which dies of the wafer 18 (see FIG. 3) are KGDs, and may also store information regarding the target location of the dies on the support surface 11 (including, e.g., the wafer-level package maps shown in FIG. 4). Based at least in part on this information, the control system 100 can instruct the movable support 22 to move to a desired orientation for each die, or at least each KGD or a binned die, on the wafer 18 (see FIG. 3). The control system 100 can also be programmed to send instructions to a motor or other device to cause the die release assembly 20 to be positioned over the die to be transferred. The control system 100 can instruct the die release assembly 20 to apply a suitable force against the backside of the film 15 to cause the dies to be transferred to the support structure 10. The control system 100 can instruct the die release assembly 20 to apply a suitable force against the backside of the film 15 to cause the binned dies to be transferred to the support structure 10 in a clustered configuration, such that dies with desirable higher performance attributes (for example, lower power, high frequencies) may be segregated to portions of the support layer where the beneficial process outcomes are expected.

FIG. 6A is a schematic side view of a die release assembly 20 disposed over a wafer mount 12 and support surface 11, according to some embodiments. Unless otherwise noted, reference numerals used in FIG. 6A represent components that are similar to or the same as components illustrated in FIGS. 1-5. For example, as shown in FIG. 6A, the wafer mount 12 with integrated device dies 16 can be disposed in close proximity relative to the support surface 11. As explained above, the support surface 11 can be aligned vertically (in the z direction) and laterally (e.g., rotationally and/or linearly in the x and/or y directions) such that selected dies 16A are laterally aligned with a desired location on the support surface 11 (which may correspond to a desired location within a package region 21). The control system 100 of FIG. 6A may operate in a manner similar to that of the control system 100 illustrated in FIG. 5.

In the embodiment of FIG. 6A, the die release assembly 20 comprises a fluid actuator 24 having a plurality of nozzles. FIGS. 6C-6E are schematic top plan views of a fluid actuator 24 with nozzles 26 arranged in nozzle patterns that can be used with the embodiment of FIG. 6A. With reference to FIG. 6A, the fluid actuator 24 of the die release assembly 20 can be activated to inject a high velocity fluid (e.g., a gas such as air, nitrogen, etc.) against the backside of the film 15. The nozzles 26 of the fluid actuator 24 can be sized and shaped asymmetrically to cause an edge 23 of a selected die 16A to contact the support surface 11 before other regions of the die 16A. For example, as shown in FIG. 6C, the nozzles 26 can comprise a plurality of polygonal (e.g., rectangular) orifices arranged adjacent one another along the fluid actuator 24. The nozzles 26 can be wider near a first end 23a than at a second end 23b. In FIG. 6C, the nozzles 26 are arranged in a single row of adjacent rectangular orifices. In FIG. 6D, the nozzles 26 are wider near a first end 23a than a second end 23b, however, the nozzles 26 are arranged in a two dimensional array of rectangular or square orifices in which the width or major dimension of the nozzles 26 decreases from the first end 23a to the second end 23b. In FIG. 6E, the nozzles 26 are similarly wider near a first end 23a, but the nozzles 26 are arranged in a two-dimensional array of rounded orifices (e.g., circular or elliptical) in which the width or major dimension of the nozzles 26 decreases from the first end 23a to the second end 23b.

When the nozzles 26 of FIGS. 6C-6E are actuated with the arrangement shown in FIG. 6A, the wider orifices near the first end 23a can create fluid streams against the film 15 to cause the film 15 to move towards the support surface 11. Because the orifices of the nozzles 26 nearer the first end 23a are wider than at the second end 23b, a higher flowrate of fluid is injected against the edge 23 of the die 16A as compared to other regions of the die 16A. The higher flowrate of fluid (and therefore a higher applied force) at the edge 23 of the die 16A can cause the edge 23 of the die 16A to contact the support surface 11 before other regions of the die 16A. Sufficient fluid pressure can be applied to cause the dies 16A to delaminate from the film 15 and transfer to the support surface 11.

Figure 6:
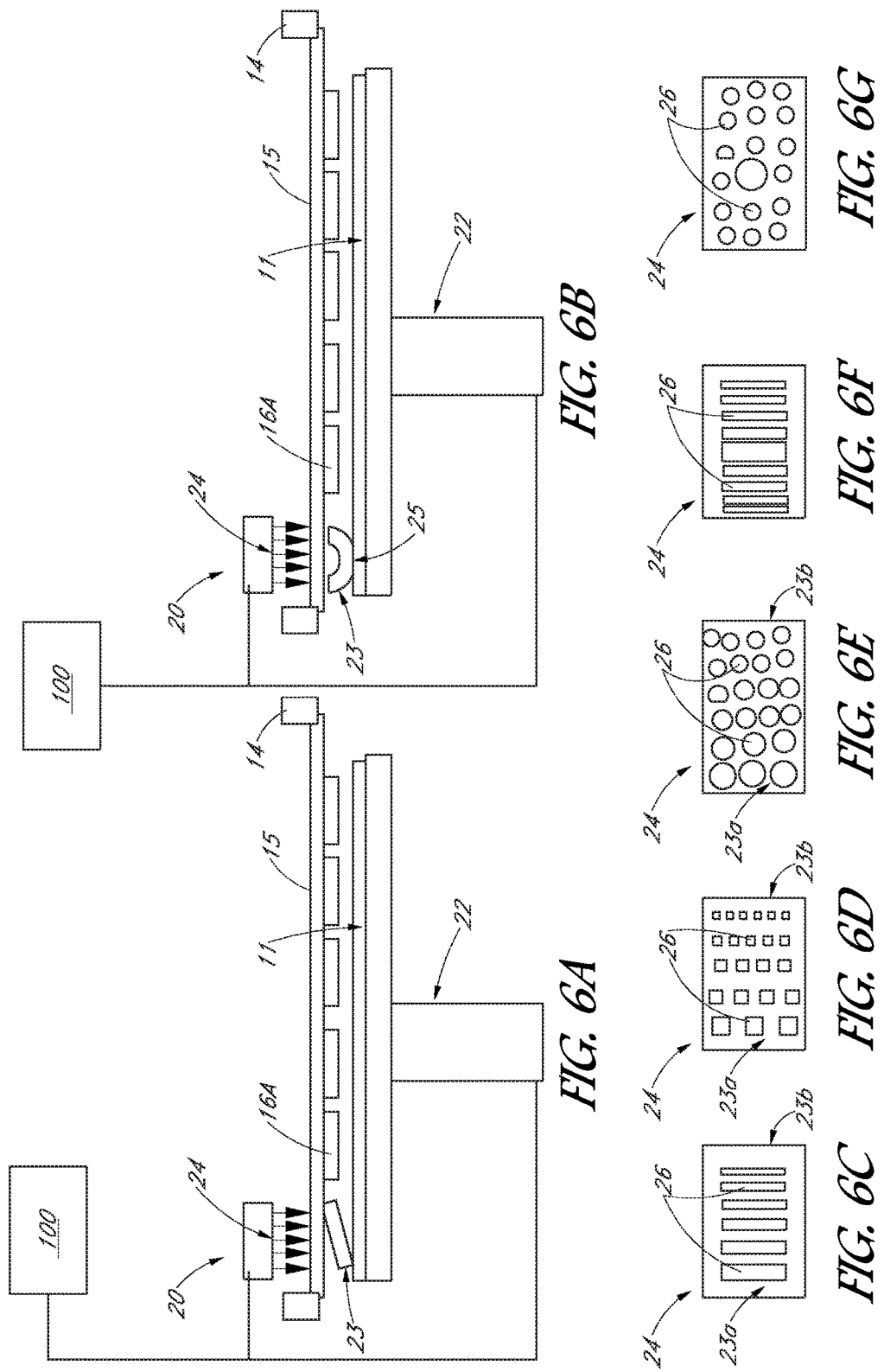
FIG. 6A is a schematic side view of a die release assembly disposed over a wafer mount and packaging support surface, according to some embodiments.
FIG. 6B is a schematic side view of a die release assembly disposed over a wafer mount and packaging support surface, according to some embodiments.
FIG. 6C is a schematic top plan view of a fluid actuator with nozzles comprising a plurality of polygonal orifices arranged adjacent one another along the fluid actuator.
FIG. 6D is a schematic top plan view of a fluid actuator with nozzles arranged in a two dimensional array of rectangular or square orifices.
FIG. 6E is a schematic top plan view of a fluid actuator with rounded nozzles arranged in a two-dimensional array.
FIG. 6F is a schematic top plan view of a fluid actuator with polygonal nozzles arranged adjacent one another, according to various embodiments.
FIG. 6G is a schematic top plan view of a fluid actuator with rounded nozzles arranged in a two-dimensional array, according to various embodiments.

FIG. 6B is a schematic side view of a die release assembly 20 disposed over a wafer mount 12 and support surface 11, according to some embodiments. Unless otherwise noted, reference numerals used in FIG. 6B represent components that are similar to or the same as components illustrated in FIGS. 1-6A. For example, as shown in FIG. 6B, the wafer mount 12 with integrated device dies 16 can be disposed in close proximity relative to the support surface 11. As explained above, the support surface 11 can be aligned vertically (in the z direction) and laterally (to mapped x and y positions) such that selected dies 16A are laterally aligned with a desired location on the support surface 11 (which may correspond to a desired location within a package region 21 or intermediate carrier surface). The control system 100 of FIG. 6B may operate in a manner similar to that of the control system 100 illustrated in FIGS. 5-6A.

As with the embodiment of FIG. 6A, the die release assembly 20 of FIG. 6B comprises a fluid actuator 24 having a plurality of nozzles. FIGS. 6F and 6G are schematic top plan views of a fluid actuator 24 with nozzles 26 arranged in a nozzle pattern that can be used with the embodiment of FIG. 6B. The nozzles 26 of the fluid actuator 24 of FIG. 6B can be sized and shaped to cause a central region 25 of a selected die 16A to contact the support surface 11 before other regions of the die 16A, such as the edge 23 of the die 16A. As shown in FIG. 6B, in such arrangements, the central region 25 of the die 16A may bend or flex so as to contact the support surface 11 before the edge 23 of the die 16A. Referring to FIG. 6F, the fluid actuator 24 can comprise a plurality of nozzles 26 with rectangular-shaped orifices. In FIG. 6F, the orifices may be widest at a central region of the actuator 24 and narrower at the end regions. Similarly, in FIG. 6G, the nozzles 26 can comprise rounded (e.g., circular or elliptical) orifices arranged in a two-dimensional array in which the larger orifices are arranged near the central region and smaller orifices are arranged near the ends of the actuator 24.

When the actuator 24 of FIG. 6B is activated, the nozzles 26 near the center of the actuator 24 may supply a greater flowrate (and hence a greater force) than nozzles 26 near the edges of the actuator 24. The increased flowrate at the center of the actuator 24 may apply sufficient force at the central region 25 of the die 16A to cause the central region 25 to bow or flex towards the support surface 11. The central region 25 can contact the support surface 11 before other regions of the die 16A. The selected die 16A can be removed from the film 15 and directly transferred to the support surface 11.

Figure 7:
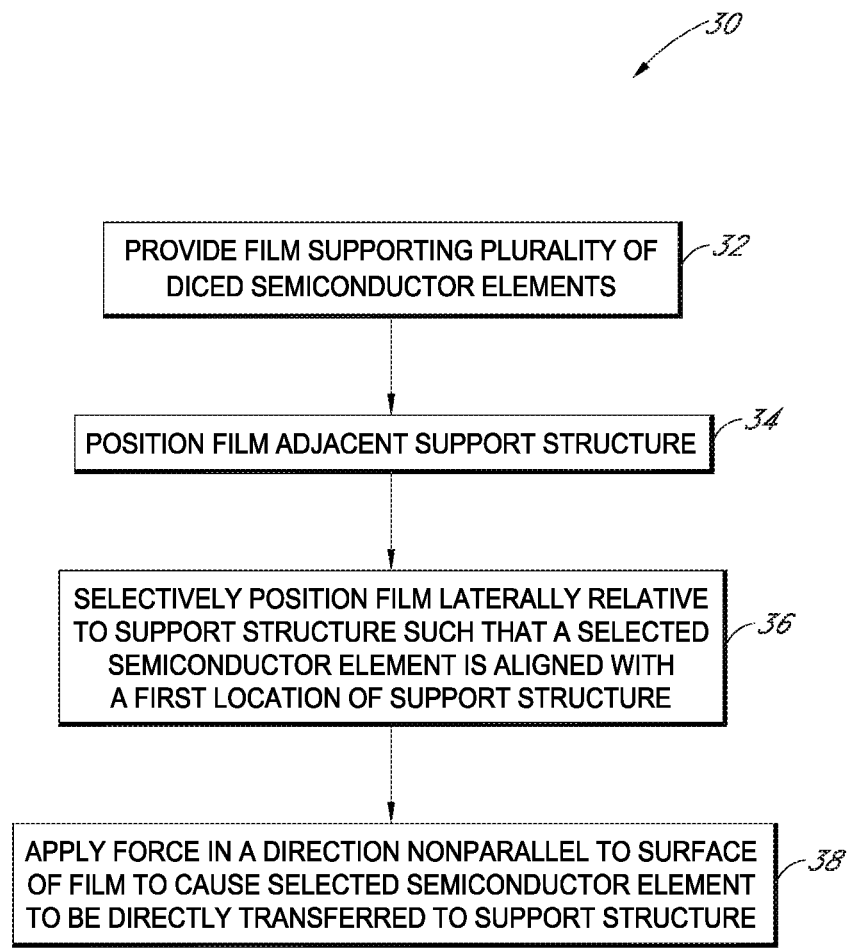
FIG. 7 is a flowchart illustrating a method for mounting dies on a packaging support structure, according to one embodiment.

FIG. 7 is a flowchart illustrating a method 30 for mounting dies on a support structure, according to one embodiment. The method 30 begins at a block 32 in which a film supporting a plurality of diced elements (e.g., semiconductor elements such as diced integrated device dies) is provided. As explained above in connection with FIG. 1, a wafer can be mounted to a film of a wafer mount. The wafer has been previously processed to have a plurality of integrated devices, which can be diced or separated using any suitable method, such as sawing. After dicing, the film (e.g., a tape)

can maintain the dies (or other elements or semiconductor elements) such that they remain adjacent one another along an adhesive surface of the film. In some embodiments, the device dies can be tested before dicing to determine and map which dies are electronically functional, i.e., which dies are known good dies, or KGDs. In some embodiments, each integrated device die may comprise a plurality of contact pads formed thereon. During the processing steps of FIG. 7, in some embodiments, the contact pads may be covered with a passivation film or exposed; however, the pads may be devoid of external contact bumps (such as solder balls).

Turning to a block 34, the film with the diced integrated devices (or other type of diced element or semiconductor element) is positioned adjacent a support structure such that an adhesive surface of the film faces a support surface of the support structure. As explained above, the support structure can comprise any suitable type of surface, including, e.g., a packaging platform (such as a package substrate, interposer, one or more device dies, one or more wafers) or an intermediate carrier (such as an adhesive sheet). In a block 36, the film can be selectively positioned laterally relative to the support structure such that a selected first die (or other type of element or semiconductor element) is aligned with a first location of the support structure. As explained above, the support structure and/or the wafer mount may be indexed to move in two-dimensions. A control system can be programmed to position the support structure relative to the film such that a selected die (e.g., a KGD) is aligned with a selected location on the support surface, such as a corresponding package region of the support surface.

Moving to a block 38, a force can be applied in a direction nonparallel to the adhesive surface of the film to cause the selected die (or other type of element or semiconductor element) to be directly transferred from the film to the support structure. For example, as explained herein, a die release assembly can be moved over the selected die and an actuator can be activated to cause the die to be released from the film and transferred to the support structure. In some embodiments, the actuator can comprise a fluid actuator having one or more nozzles configured to inject a high velocity fluid (e.g., a gas such as air or nitrogen, or a liquid) against the backside of the film to cause the die to be transferred to the support structure. The nozzles can be arranged in any suitable pattern. For example, in some embodiments, the nozzles can be arranged so as to cause an edge of the die to contact the support surface before other regions of the die. In other embodiments, the nozzles can be arranged so as to cause a central region of the die to bow and contact the support surface before other regions of the die. In still other embodiments, the actuator can comprise a plunger or other mechanical actuator configured to apply a force nonparallel to the film.

Advantageously, the embodiments disclosed herein with respect to FIGS. 1-7 can be used to efficiently transfer dies or other elements from a dicing film directly to a support structure, which may be an intermediate carrier or a final packaging platform. Moreover, the embodiments disclosed in FIGS. 1-7 can enable package assemblers to utilize only KGDs in packages, which can improve package yield and reduce costs associated with using dysfunctional device dies. Further, the two-dimensional selective placement of selected dies on the support structure can enable the use of accurate and efficient wafer-level packaging in which KGDs are accurately and directly mounted to a surface in which the die has a fixed relationship with other components of the package, such as another die or die stack, a wafer or wafer stack, a package substrate, encapsulating or mold material to be formed after transfer onto the support structure, etc.

When the dies are assembled on the corresponding package regions of the support surface, the support surface can be molded by a filling material or encapsulant which is applied over portions of the dies and/or in gaps between adjacent dies. In some arrangements, the backsides of the dies can be thinned. The support surface (which may comprise a wafer or a web of substrate material, such as PCB or lead frame) may be subsequently singulated to yield a plurality of singulated device packages.

Figure 8A:
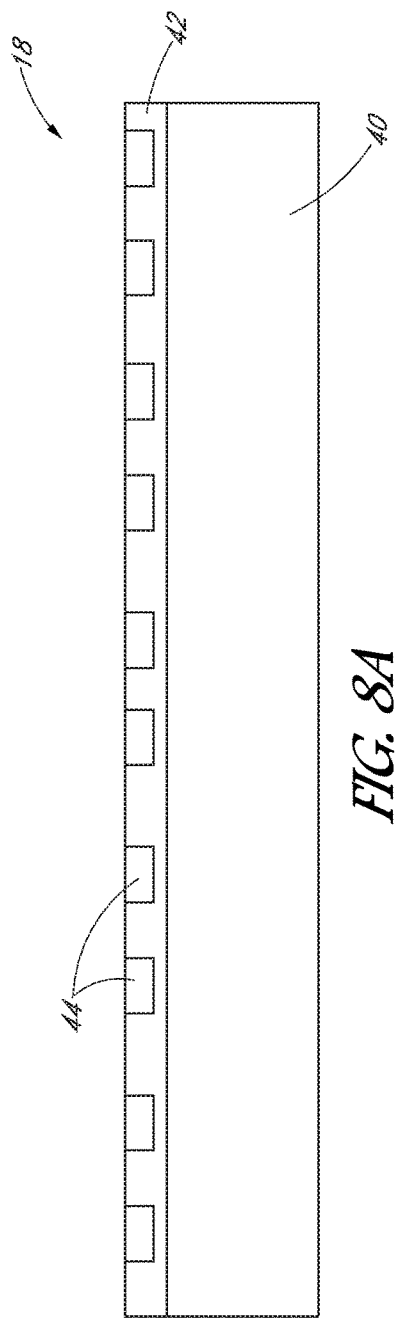
FIG. 8A is a schematic side cross-sectional view of a wafer comprising a substrate, a nonconductive layer deposited on the substrate, and a plurality of conductive contacts formed in the nonconductive layer.

FIGS. 8A-8L are schematic side cross-sectional views of various stages of a method for bonding integrated device dies, according to some embodiments. It should be appreciated that the fluid actuator and relative motion embodiments disclosed above with respect to FIGS. 1-7 may also apply to the embodiment shown in FIGS. 8A-8L. For example, the flowchart in FIG. 7 illustrates steps of a manufacturing method which also apply to FIGS. 8A-8L. Moreover, although FIGS. 8A-8L illustrate direct bonding of integrated device dies, it should be appreciated that the methods can alternatively be used to direct bond other types of semiconductor elements, such as interposers, reconstituted dies, etc. FIG. 8A illustrates a wafer 18 comprising a substrate 40, a nonconductive layer 42 deposited on the substrate 40, and a plurality of conductive contacts 44 formed in the nonconductive layer 42. The substrate 40 can comprise silicon or any other suitable semiconductor material, glass, ceramic, or a polymeric layer or panel. The nonconductive layer 42 can comprise a suitable nonconductive material, such as, for example, inorganic or organic dielectric material, such as silicon dioxide, silicon carbide, diamond-like carbon, a polymeric layer, a composite material or various combinations of these materials, etc. Also, portions of the conductor 44 may be formed by damascene and non-damascene metallization methods. The conductive contacts 44 can be defined by a damascene process, in which the contacts 44 are filled inside trenches formed in the nonconductive layer 42, and may be coplanar with, slightly protrude above (e.g., 2-20 nm), or maybe slightly recessed below (e.g., 2-20 nm) below the surface of the nonconductive layer 42. The contacts 44 can comprise any suitable conductor, such as copper, gold, etc. The surfaces of the contacts 44 and the nonconductive layer 42 can be prepared for direct bonding with another wafer or other structure. For example, the surfaces of the contacts 44 and/or the nonconductive layer 42 may be polished (using, e.g., chemical-mechanical polishing techniques) so as to ensure that the bonding surfaces are extremely smooth. Additional details regarding surface preparations of the contacts 44 and nonconductive layer 42 may be found throughout U.S. Pat. Nos. 6,902,987; 6,566,694; 7,109,092; 6,962,835; and 8,389,378, the entire contents of each of which are incorporated by reference herein in their entirety and for all purposes.

Figure 8B:
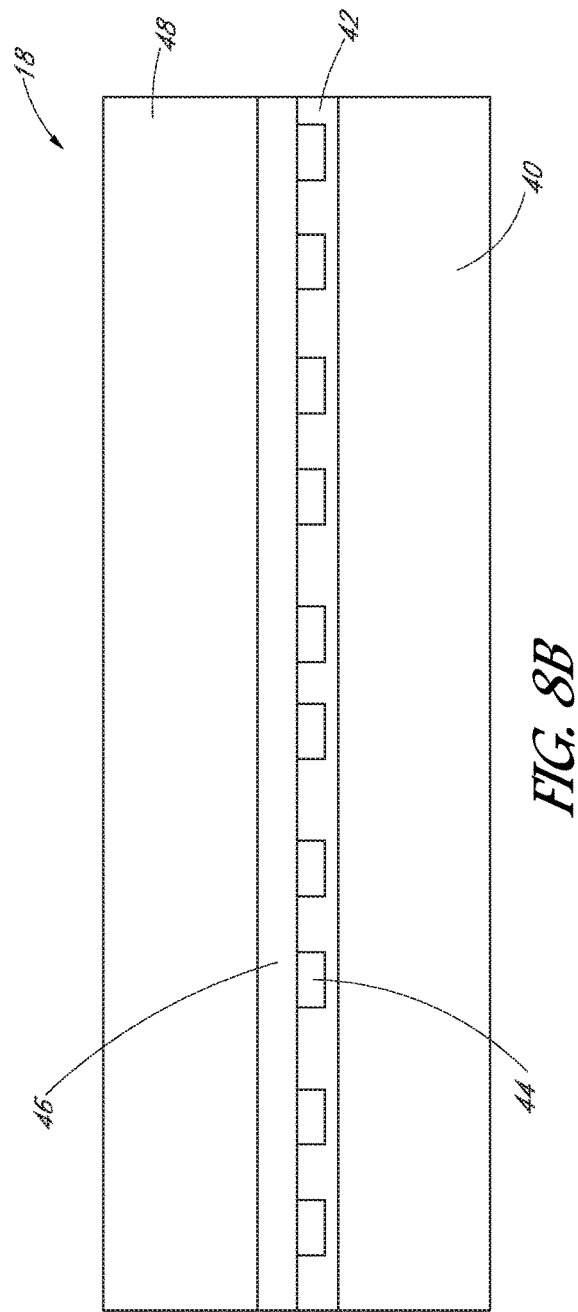
FIG. 8B is a schematic side cross-sectional view of a handle wafer attached to the substrate over the nonconductive layer and the contacts.

Turning to FIG. 8B, a handle wafer 48 can be attached to the substrate 40 over the nonconductive layer 42 and the contacts 44 by way of an adhesive 46. The handle wafer 48 can comprise silicon or another semiconductor material that is sufficiently thick so as to act as a handle for moving or otherwise manipulating the wafer 18. In FIG. 8C, the backside of the substrate 40 can be thinned to a desired thickness suitable for the integrated device dies ultimately formed from the wafer 18. For example, the substrate 40 can be thinned to a thickness in a range of 10 microns to 200 microns, in a range of 10 microns to 100 microns, in a range of 20 microns to 75 microns, in a range of 25 microns to 50 microns, or any other suitable thickness. The backside of the thinned wafer 18 can be polished or otherwise planarized in a manner similar to the front side of the wafer 18. In FIG. 8D, another nonconductive layer 52 and another set of contacts 54 can be formed on the polished backside of the wafer 18 in a manner similar to the contacts 44 and nonconductive layer 42. The second set of contacts 54 may communicate with integrated circuitry within the substrate 40 by way, for example, of through-silicon vias (TSVs) and/or back-end-of-line (BEOL) metallization. The nonconductive layer 52 and contacts 54 may also be polished and prepared for bonding as explained above.

Figure 8E:
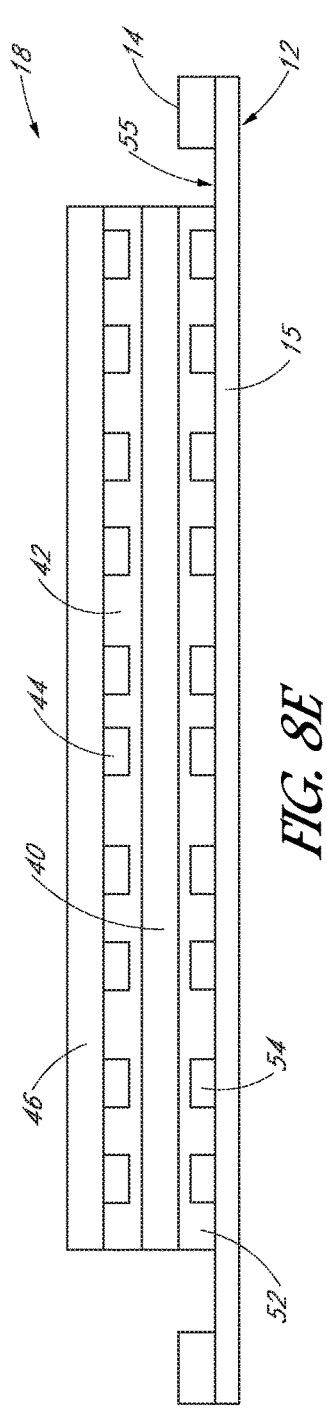
FIG. 8E is a schematic side cross-sectional view of the wafer mounted on a wafer mount.

In FIG. 8E, the wafer 18 can be mounted on a wafer mount 12, similar to the wafer mount 12 described above in connection with FIGS. 1-7. For example, the wafer mount 12 can comprise a frame 14 and a film 15 supported by the frame 14. The wafer 18 can be adhered to an adhesive surface 55 of the film 15. In some embodiments, the wafer 18 can be coated with a protective polymer to protect the active surface of the wafer 18 from the film 15. In other embodiments, no protective coating may be used, and any residue from the film 15 may be subsequently cleaned. The handle wafer 48 can be removed from the adhesive 46.

Figure 8F:
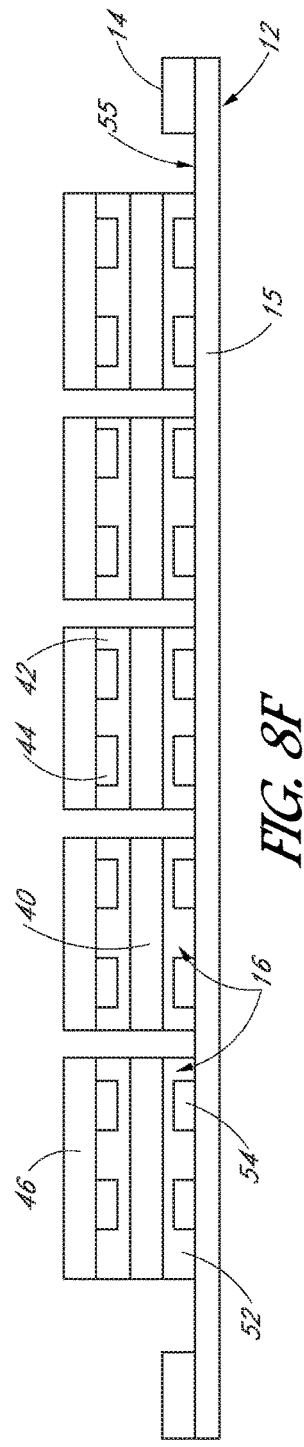
FIG. 8F is a schematic side cross-sectional view of the wafer after dicing into a plurality of integrated device dies.
Figure 8G:
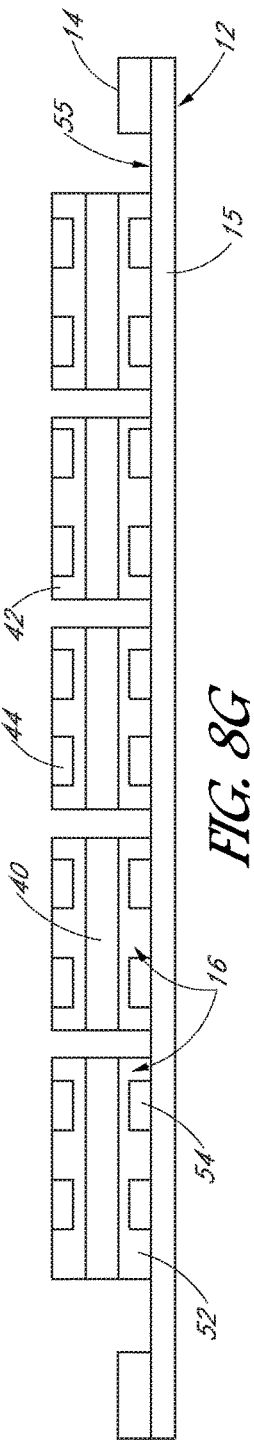
FIG. 8G is a schematic side cross-sectional view of the structure after a temporary adhesive is removed from backsides of the dies.

Turning to FIG. 8F, the wafer 18 can be diced into a plurality of integrated device dies 16. For example, the wafer 18 can be sawed, punched, or otherwise singulated so as to form the diced integrated device dies 16. As with the embodiments of FIGS. 1-7, the device dies 16 can comprise any suitable type of die, such as an integrated circuit, such as memory or processor, a MEMS die, etc. As shown in FIG. 8F, the dicing operation may fully dice or singulate the dies 16, but leave the film 15 intact and continuous, although the dicing saw may leave scorings or markings on the film 15. The intact film 15 can support the diced dies 16 and maintain their relative positions on the film 15. In FIG. 8G, the adhesive 46 can be removed by any suitable method, such as by exposure to electromagnetic radiation (e.g., ultraviolet radiation) and/or a solvent.

Figure 8H:
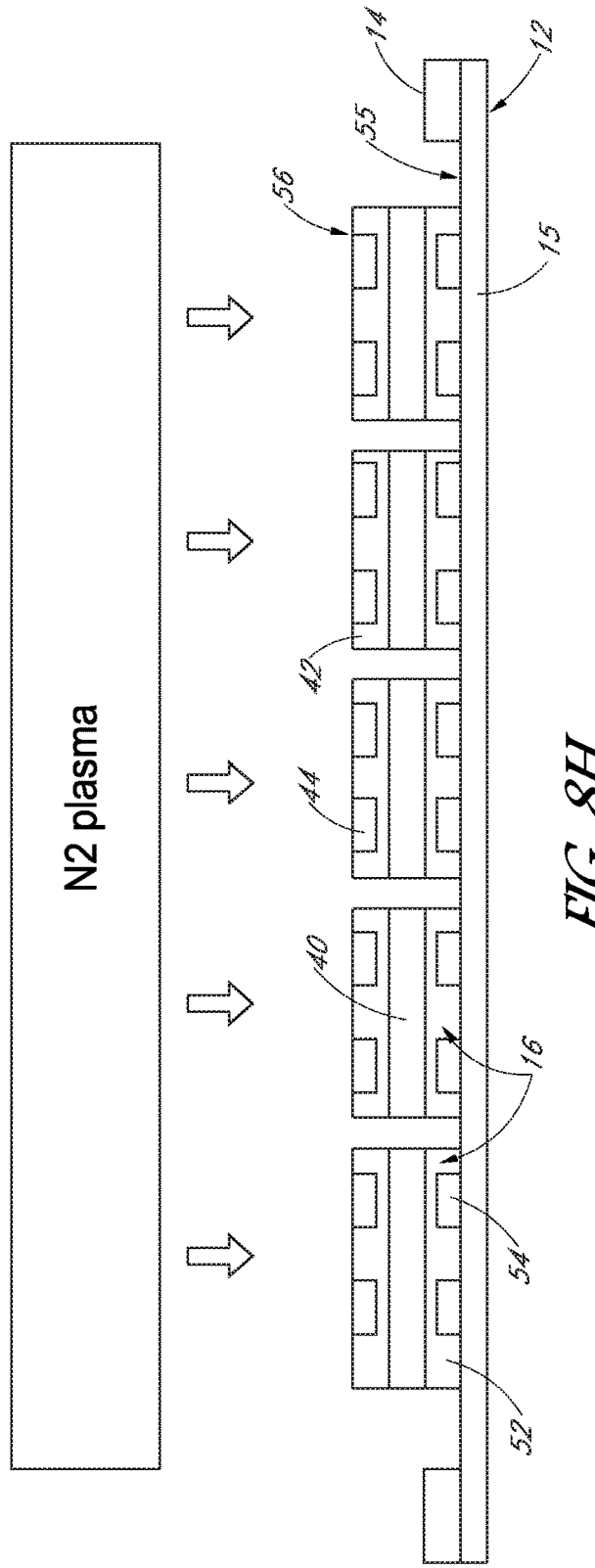
FIG. 8H is a schematic side cross-sectional view of integrated device dies with bonding surfaces being exposed to a nitrogen-containing plasma.

In FIG. 8H, bonding surfaces 56 of the integrated device dies 16 can be planarized (e.g., polished by chemical mechanical polishing), activated (e.g., very slightly etched) and/or terminated with a suitable species. For example, as shown in FIG. 8H, the bonding surfaces 56 (which may comprise silicon oxide) can be exposed to nitrogen-containing plasma in a plasma chamber. For example, the plasma process can comprise a reactive ion etching process in some embodiments. The very slight etch can result in a root-mean-square micro-roughness of less than 0.5 nm, e.g., in a range of 0.1 nm to 3 nm. Beneficially, the processes disclosed herein (e.g., polishing, activation, and/or termination) can be performed while the dies 16 are mounted to the film 15, which can improve the efficiency of the direct bonding processes. For example, the processes disclosed herein may be conducted at relatively low temperatures (e.g., in a range of 50° C. to 100° C.), which may be a sufficiently low temperature and/or may be for sufficiently low processing times (e.g., less than 10 minutes, or less than 6 minutes) such that the film 15 can accommodate the direct bonding processes without degrading or melting. In other embodiments, the bonding surfaces 56 can be exposed to a nitrogen-containing solution, e.g., an ammonia-based solution. Terminating the bonding surfaces 56 with nitrogen-containing species can advantageously enhance the direct bonding of the dies 16 to other semiconductor elements. Additional details of activation and termination processes are disclosed throughout U.S. Pat. No. 6,902,987, the entire contents of which are incorporated by reference herein in their entirety and for all purposes.

Figure 8I:
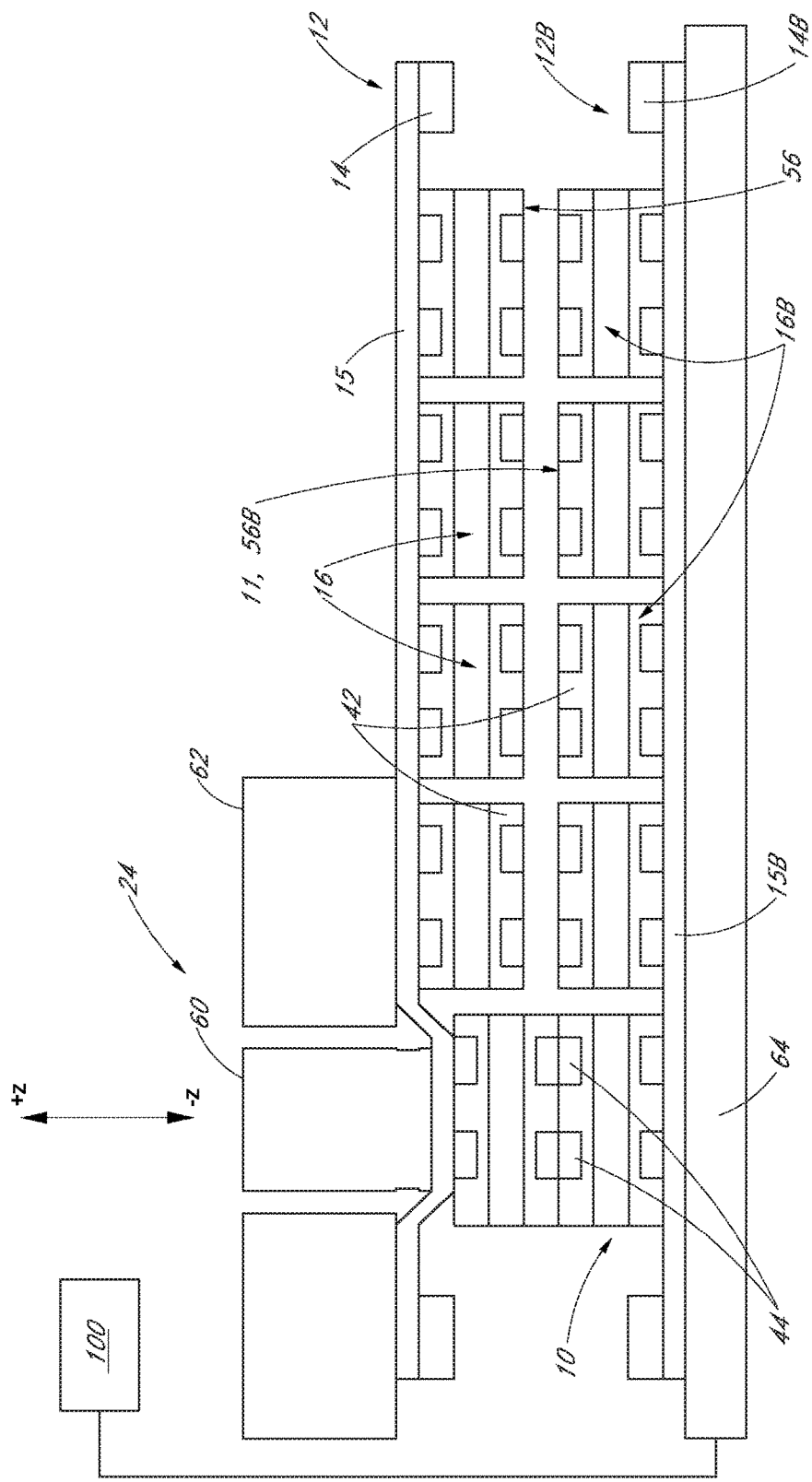
FIG. 8I is a schematic side cross-sectional view of integrated device dies after being transferred from the film directly to a support structure.

Turning to FIG. 8I, the integrated device dies 16 shown in FIGS. 8F-8H can be transferred from the film 15 directly to a support structure 10. In the illustrated embodiment of FIG. 8I, the support structure 10 for the dies 16 comprises a second set of dies 16B mounted on a second wafer mount 12B comprising a second frame 14B which supports a second film 15B. However, as with the embodiments of FIGS. 1-7, in other embodiments the support structure 10 can comprise any suitable type of structure, including, e.g., a packaging platform, such as a package substrate (e.g., PCB, glass, plastic, leadframe, ceramic substrate, silicon interposer, etc.), a wafer or stack of wafers, a reconstituted wafer, panel, or reconstituted panel, etc. In other embodiments, the support structure 10 may comprise an intermediate carrier, such as an adhesive sheet or mechanical die carrier, which can be used for further packaging steps (e.g., molding for wafer reconstitution) or to transport the integrated device dies 16 to the ultimate packaging platform.

The first film 15 and dies 16 can be mounted to a first platform 62. As shown in FIG. 8I, the first film 15 and dies 16 can be inverted in preparation for direct bonding with the second dies 16B. The second film 15B to which the second dies 16B are adhered can be mounted to a second platform 64. The first and second platforms 62, 64 can comprise any suitable structure for supporting the respective wafer mounts 12, 12B. In the illustrated embodiment, for example, the first and second platforms 62, 64 can comprise vacuum chucks which apply a negative pressure to each film 15, 15B so as to secure the films 15, 15B to the respective platforms 62, 64. In FIG. 8I, the dies 16 from FIGS. 8F-8H are illustrated in an inverted configuration, i.e., disposed over the second set of dies 16B. It should be appreciated, however, that in other arrangements, the dies 16 from FIGS. 8F-8H may instead be disposed on the second platform 64, and the dies 16B can be disposed on the first platform 62. Further, although the processing steps described above in connection with FIGS. 8A-8H are described with reference to the dies 16, the same processing steps may also be applied to the surfaces of the second set of dies 16B in preparation for direct bonding, such as planarization, activation and termination.

As with the embodiments of FIGS. 1-7, the control system 100 can store information regarding each die 16, 16B that is to be bonded. For example, the control system 100 can determine which dies 16 on the first film are KGDs. The control system 100 can also be configured to identify which individual dies 16 from the first set are to be bonded to which individual dies 16B from the second set. The control system 100 can instruct a motor or other suitable apparatus to cause the first platform 62 to move relative to the second platform 64 (or vice versa) so as to laterally align a selected die 16 with a corresponding selected die 16B from the second set. For example, as explained above, the first platform 62 can be moved laterally in two dimensions (i.e., in the x and y dimensions, e.g., rotationally and/or linearly in the x and/or y directions) to align the selected die 16 with the corresponding die 16B in the lateral direction.

Once the dies 16, 16B are generally aligned, a die release assembly 24, under the control of the control system 100, can apply a force against the backside of the film 15 to cause the die 16 to be transferred from the film 15 to the support surface 11, which can also comprise a bonding surface 56B of the corresponding second die 16B. For example, as shown in FIG. 8I, the die release assembly 24 can comprise a plunger 60 which is driven along the z direction to apply a contact force against the backside of the film 15.

In some embodiments, the plunger 60 can apply an initial downward force (which may include pressure sensing) against the film 15 in the −z direction to cause one die 16 to be disposed below the other dies 16. The plunger arrangement can comprise a displacement and/or pressure sensor with a feedback control system to accurately control the amount of force and/or displacement applied by the plunger 60. An alignment system can be activated (by the control system 100 and/or a user) to estimate the degree of misalignment in the x, y, and/or z directions of the die 16 relative to the second die 16B. The alignment system can communicate with the control system 100 to provide feedback with respect to the degree of misalignment. The alignment system can comprise an optical measurement system in some arrangements. For example, the alignment system can comprise one or more cameras in some embodiments. In other embodiments, an interferometric alignment system comprising one or more lasers can be used. The control system 100 can iteratively send commands to cause the first platform 62 to move align the selected die 16 relative to the second die 16B in two dimensions.

Precision movement of the plunger 60 (and/or the second platform 64) along the z-direction can cause the bonding surface 56 of the first die to contact and directly bond with the corresponding bonding surface 56B of the second die 16B. The direct bond between the dies 16, 16B can comprise a chemical (e.g., covalent) bond in which the nonconductive layers 42 and the contacts 44 of the respective dies 16, 16B are bonded to one another without an intervening adhesive. The direct bonding process may be conducted at room temperature in some embodiments. The high degree of smoothness of the dies prior to bonding can improve the strength of the direct bond. For example, prior to bonding the bonding surfaces of the dies may have planarized surfaces with a surface roughness (RMS) in a range of 0.5 and 1.5 nm. In various embodiments, a post-bonding anneal may be performed (at a temperature in a range of 100° C. to 400° C.) to further enhance the bonding. In various embodiments, the direct bond can have a bond strength of at least 400 mJ/m$^2$ (e.g., at least 2000 mJ/m$^2$). Additional details of direct bonding processes may be found in U.S. Pat. Nos. 6,902,987; 6,566,694; 7,109,092; 6,962,835; and 8,389,378, the entire contents of each of which are incorporated by reference herein in their entirety and for all purposes. In some embodiments, the plunger 60 may comprise one or more internal channels through which a fluid may be supplied. The fluid may comprise a heated or cooled fluid which can enhance the bonding process during the transfer of the dies 16.

Figure 8J:
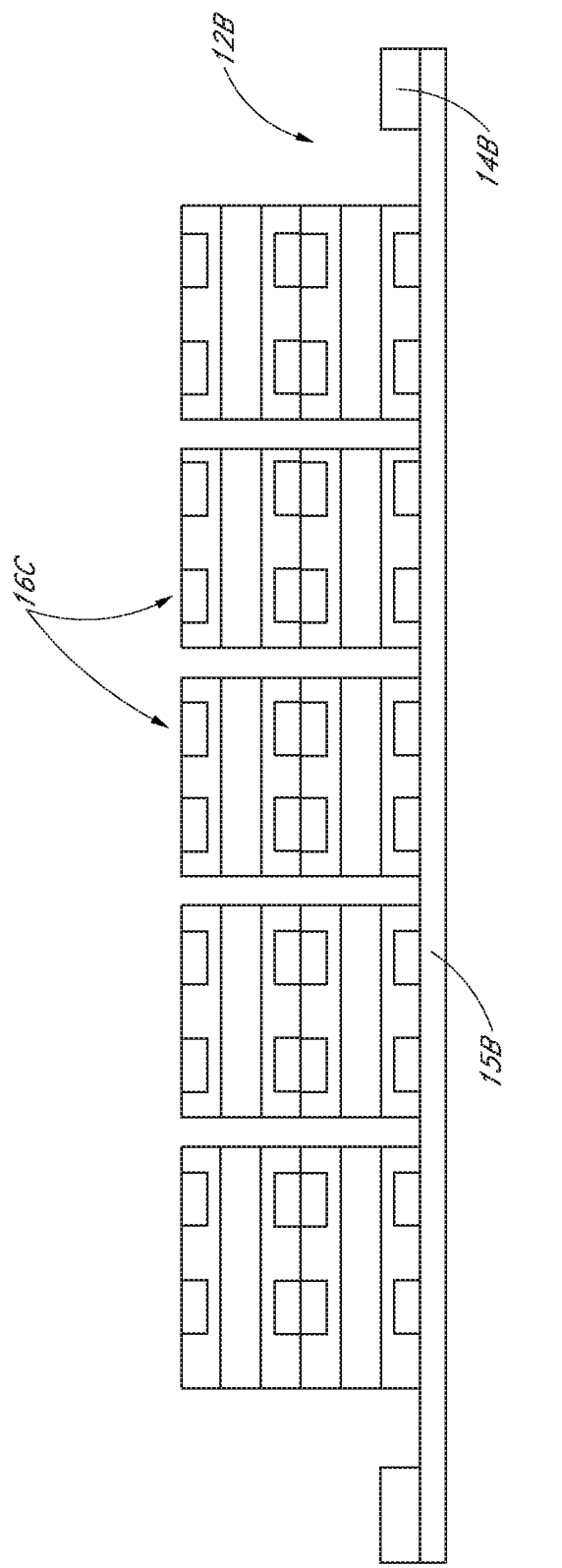
FIG. 8J is a schematic side cross-sectional view of a plurality of bonded dies which are stacked and directly bonded to one another.

Once the selected dies 16, 16B are directly bonded, the plunger 60 can be retracted along the +z direction. The bonding force between the dies 16, 16B may be greater than the adhesive force between the die 16 and the film 15, such that retraction of the plunger 60 can cause the die 16 to release from the film 15. In some arrangements, the adhesion between the die 16 and film 15 may have been reduced by exposing the back side of the film 15 to a radiation source, such as, for example, a UV light or laser. Once the selected die 16 is released, the control system 100 can instruct the plunger 60 and the first platform 62 to move to another pair of dies to be bonded until each die 16 (or each KGD) on the first wafer mount 12 is transferred and bonded to an associated die 16B (which may also be a KGD) on the second wafer mount 12B. FIG. 8J illustrates a plurality of bonded dies 16C which are stacked and directly bonded to one another. The bonded dies 16C can remain attached to the second film 15B and/or to the second platform 64 (not shown in FIG. 8J). Each die can be bonded sufficiently to allow release from the film 15 in much shorter time frames than, e.g., thermocompression bonding. The bond may include non-conductive to non-conductive (e.g., oxide) surface chemical bonding. Subsequent heating may enhance the non-conductive surface bonding, and may also enhance or cause bonding of conductive surfaces of aligned contacts 44 of the dies 16, 16B. Furthermore, the techniques described herein facilitate direct bonding of thinned dies 16, such as may be difficult to handle by conventional pick-and-place robots.

Figure 8K:
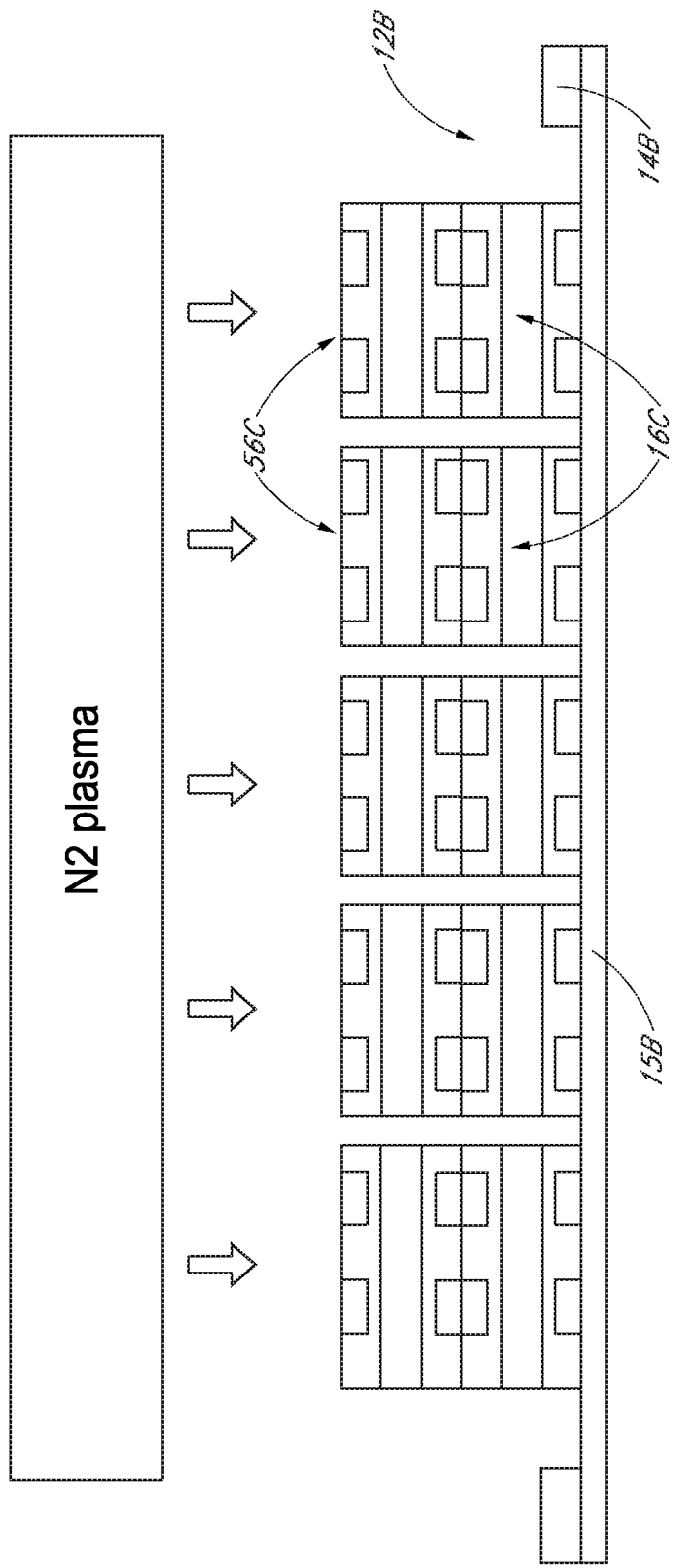
FIG. 8K is a schematic side cross-sectional view of the exposed active surface of the bonded dies being prepared for direct bonding to another set of device dies.
Figure 8L:
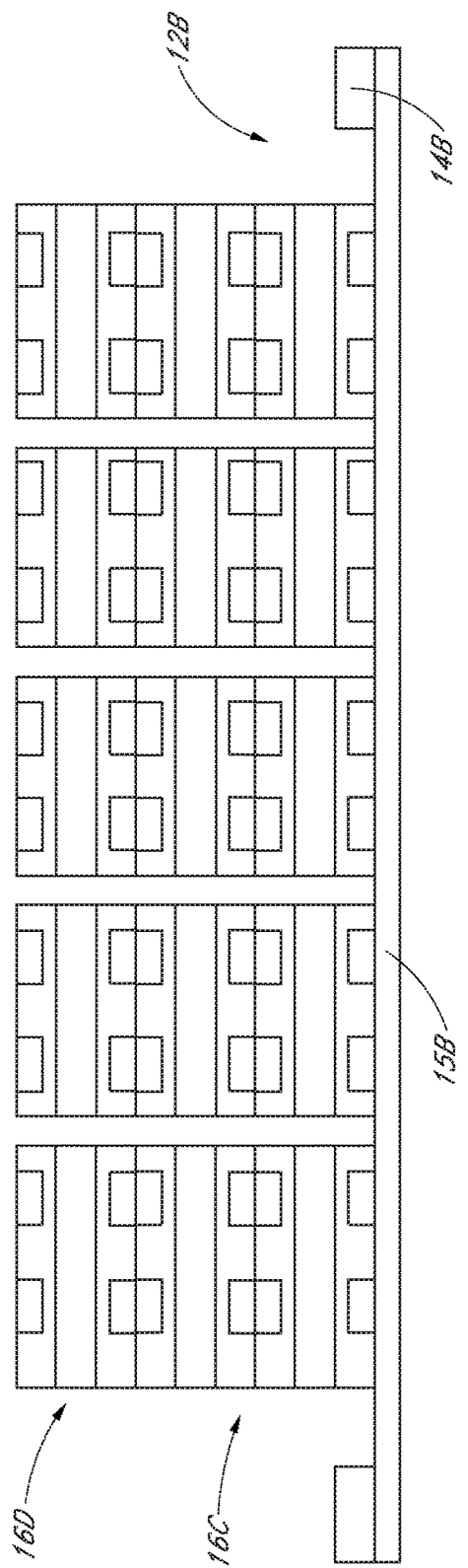
FIG. 8L is a schematic side cross-sectional view of a third set of dies directly bonded to the stack of bonded dies.

Turning to FIG. 8K, the exposed active surface of the bonded dies 16C can comprise bonding surfaces 56C which can be prepared for direct bonding to another set of device dies, in some embodiments. For example, as with FIG. 8H, the bonding surfaces 56C can be activated (e.g., by very slight etching) and/or terminated with a suitable species while the dies 16C are mounted on the film 15. Activation and termination can be conducted sequentially or in a single process. For example, as shown in FIG. 8K, the bonding surfaces 56C can be exposed to nitrogen-containing plasma in a plasma chamber. In other embodiments, the bonding surfaces 56 can be exposed to a nitrogen-containing solution, e.g., an ammonia-based solution, as explained above. FIG. 8L illustrates a third set of dies 16D directly bonded to the dies 16C. The bonding of the third dies 16D to the bonded dies 16C may be performed as explained above with respect to FIG. 8I. The process can continue until the desired number of dies are stacked and directly bonded to one another. As above, when the direct bonding is completed, the stacked dies can be packaged in any suitable manner. For example, the dies can be encapsulated at least in part by a molding or filling material which fills gaps between adjacent dies. The encapsulated dies can be singulated and mounted to a package substrate, such as a PCB, leadframe, ceramic substrate, etc. In other embodiments, the die stacks may already be mounted on a packaging substrate or large process die, in place of the second film 15B, during the bonding process.

Thus, in the illustrated embodiment, semiconductor elements (e.g., device dies 16) can be mounted to a film 15 for direct bonding processes. For example, as shown herein, the dies 16 can be diced on the film 15, polished on the film 15, and activated and/or terminated on the film 15. By processing the dies 16 on the film 15, the efficiency and efficacy of the direct bonding techniques can be improved.

Figure 8N:
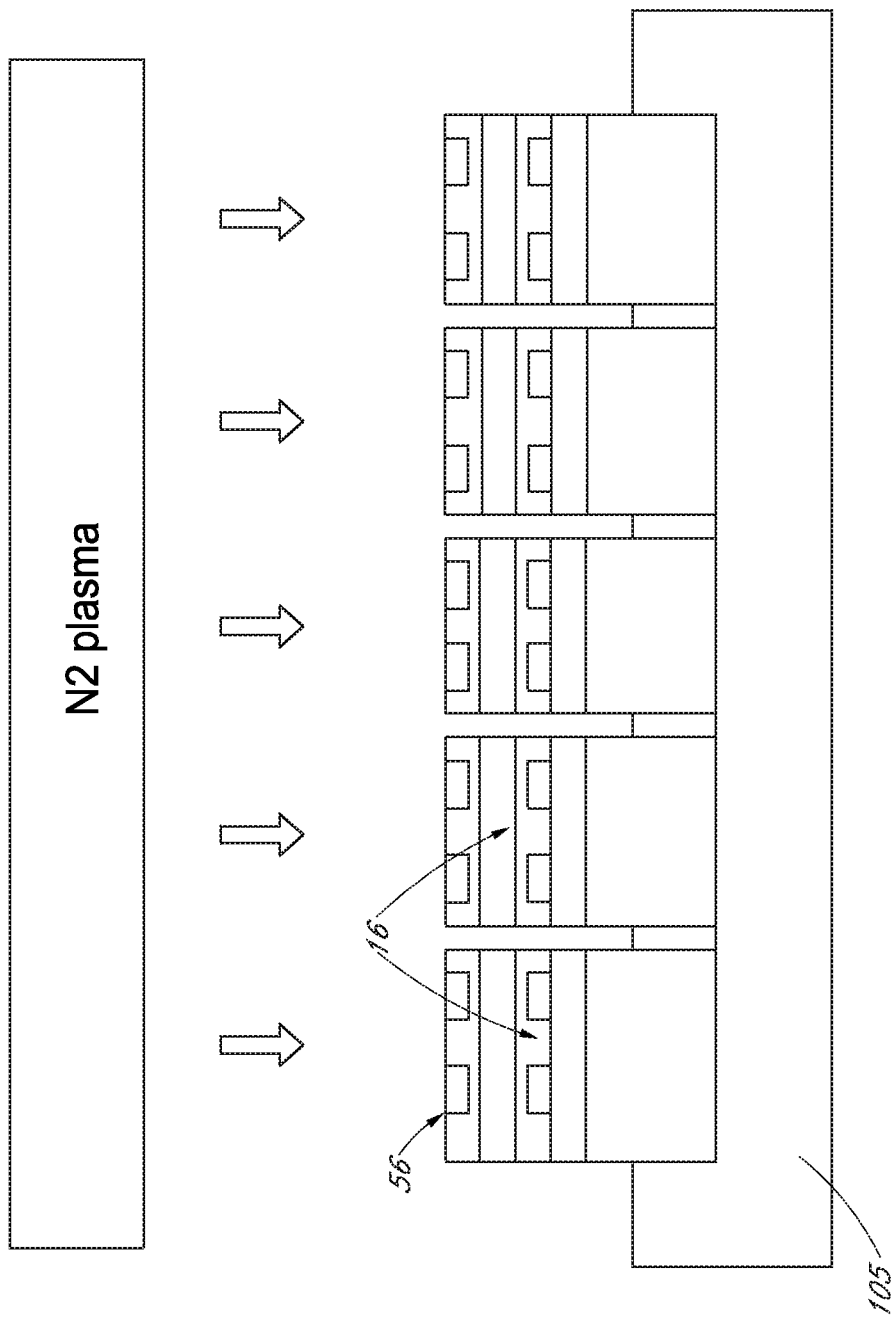
FIG. 8N is a schematic side cross-sectional view of dies that are exposed to a nitrogen-containing plasma while disposed in the waffle pack.
Figure 80:
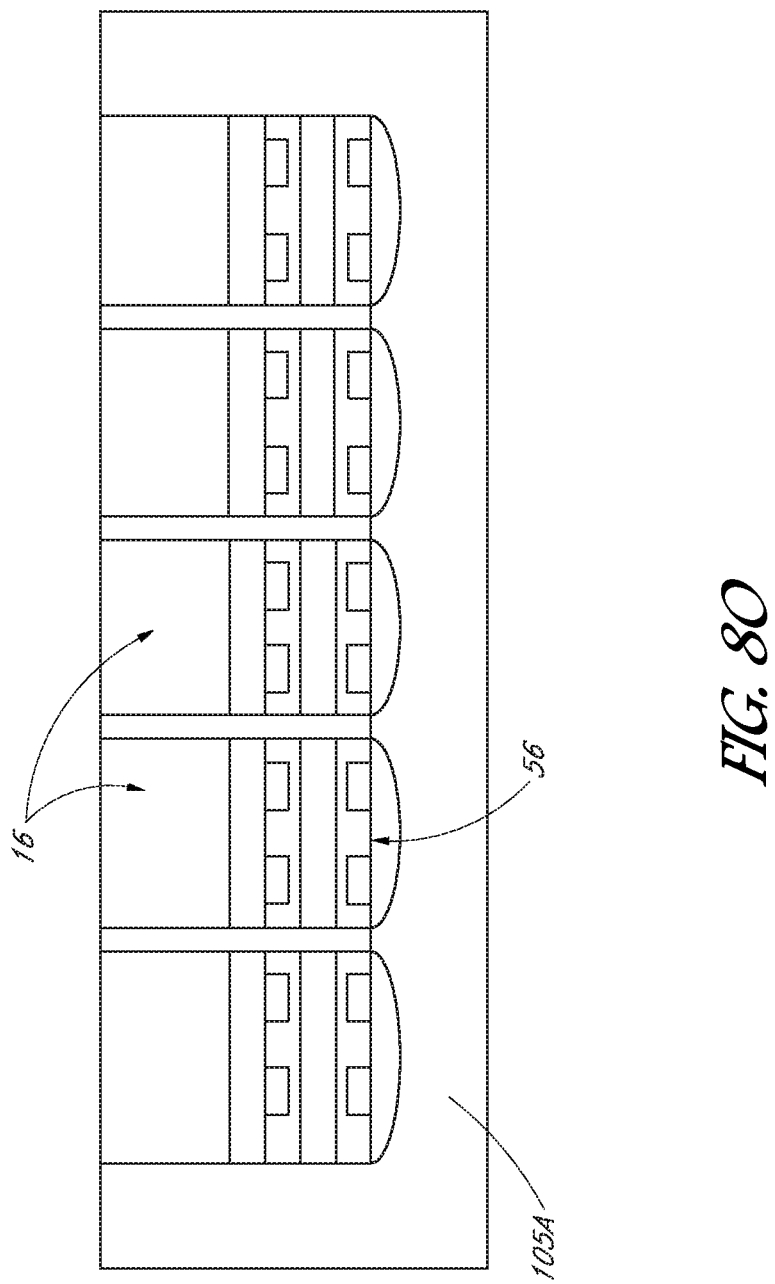

FIGS. 8M-8O illustrate an alternative embodiment, which can be used in conjunction with, or as an alternative to, various steps of the process illustrated in FIGS. 8A-8L. For example, as shown in FIG. 8M, in some embodiments, the dies 16 can be transferred from the film 15 to a waffle pack 105 that has a plurality of recesses 106 formed therein. As shown in FIG. 8M, the dies 16 can be inverted and placed in the corresponding recesses 106 with the bonding surfaces 56 facing upward. Turning to FIG. 8N, various processing steps can be performed on the dies 16 in the waffle pack 105, such as polishing, termination, and/or activation. As shown in FIG. 8N, for example, the bonding surface 56 can be exposed to a nitrogen plasma to both activate and terminate for direct bonding. Beneficially, the waffle pack 105 can be made of a material which can undergo higher temperature processing for longer periods of time than the processes used in conjunction with the film 15. For example, the dies 16 can be heated to 300° C. to 400° C. when positioned in the waffle pack 105. Turning to FIG. 8O, the processed dies 16 can be positioned (e.g., via a pick and place machine, or other system) in corresponding recesses of a waffle pack 105A, which may be different from the waffle pack 105. For example, the waffle pack 105 of FIGS. 8M and 8N may be flipped over so as to transfer the dies 16 to the waffle pack 105A. The dies 16 in FIG. 8O can be processed for stacking of additional dies or other semiconductor elements, as explained above.

Figure 9:
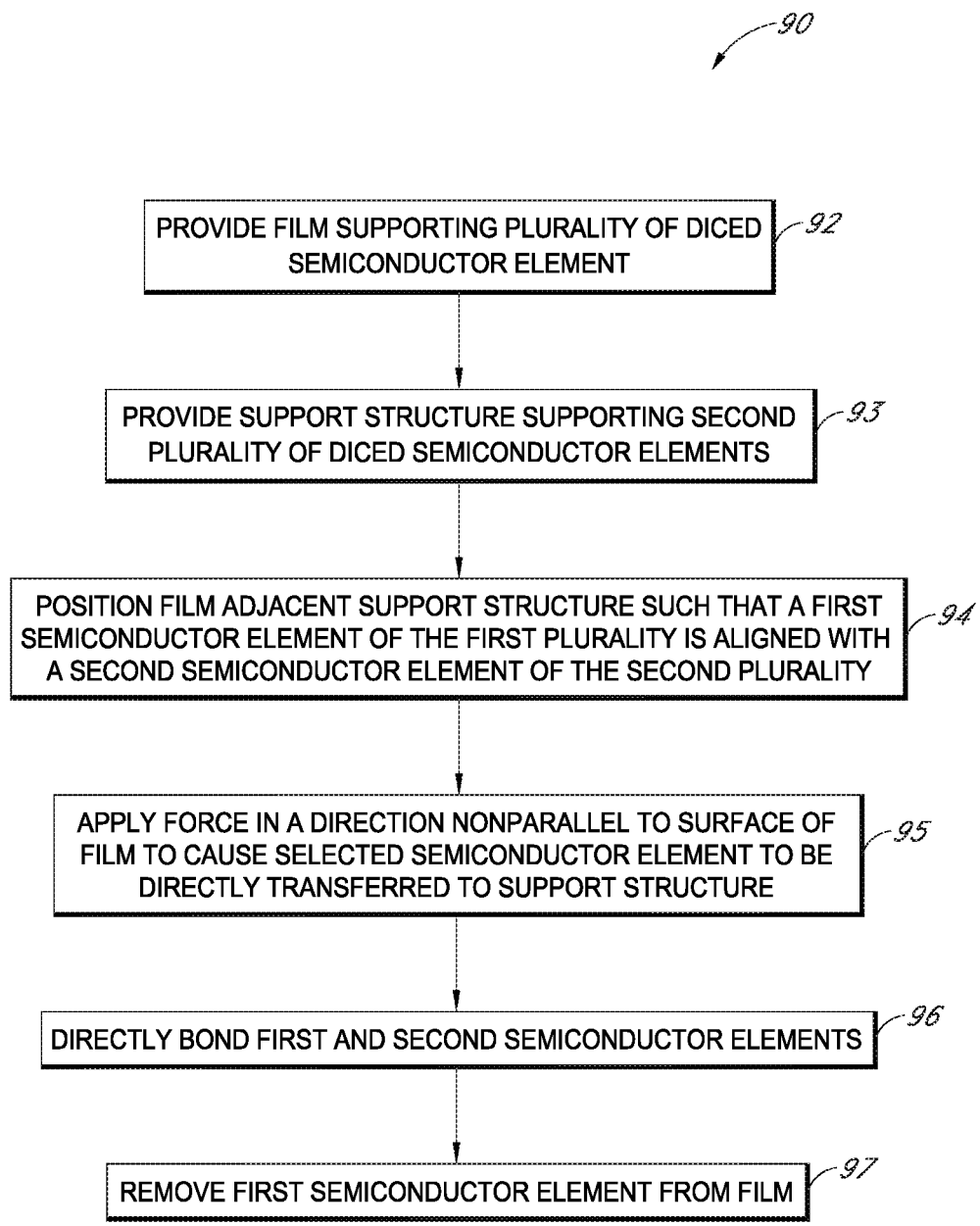
FIG. 9 is a flowchart illustrating a method for bonding integrated device dies, according to one embodiment.

FIG. 9 is a flowchart illustrating a method 90 for bonding elements (e.g., semiconductor elements such as integrated device dies), according to one embodiment. In a block 92, a film which supports a plurality of diced semiconductor elements (e.g., diced integrated device dies) is provided. As with FIG. 7, the semiconductor elements can comprise any suitable type of device die, such as a processor die, MEMS die, memory die, etc., or may comprise an interposer, a reconstituted die, or any other suitable type of semiconductor element. In other embodiments, the elements may comprise other types of devices or substrates, including elements that may or may not comprise a semiconductor material. The diced semiconductor elements can be disposed adjacent one another along a first surface of the film. In embodiments in which the semiconductor elements comprise device dies, the dies may be tested for electrical and/or electronic functionality prior to dicing to identify KGDs. The semiconductor elements can be diced using any suitable technique, such as sawing, punching, etc.

In a block 93, a support structure which supports a second plurality of diced semiconductor elements (e.g., integrated device dies) is provided. The second plurality of semiconductor elements (e.g., diced dies) can be disposed adjacent one another along a second surface of the support structure. The semiconductor elements of the second plurality can comprise any suitable type of device die, such as a processor die, MEMS die, memory die, etc., or can comprise an interposer, a reconstituted die, or other type of semiconductor element. In embodiments in which the semiconductor elements comprise device dies, the dies of the second plurality may be tested for electrical and/or electronic functionality prior to dicing to identify KGDs. The semiconductor elements can be diced using any suitable technique, such as sawing, punching, etc.

In a block 94, the film can be positioned adjacent the support structure such that a selected first semiconductor element (which may be a KGD) from the first plurality of semiconductor elements is aligned with and faces a second semiconductor element (which may also be a KGD) from the second plurality of diced semiconductor elements. The film can be selectively positioned laterally in two dimensions so as to align the first and second semiconductor elements. Various types of alignment systems (such as optical alignment systems) may be used to measure the degree of misalignment between the two semiconductor elements.

Moving to a block 95, a force can be applied in a direction nonparallel to the first or second surfaces to cause the first semiconductor element to contact the second semiconductor element. In some embodiments, the force can be applied by a plunger which contacts the backside of the film. In other embodiments, the force can be applied by a high velocity fluid which is passed through one or more nozzles. The applied force can cause the first semiconductor element to be transferred to the second semiconductor element.

Turning to a block 96, the first semiconductor element can be directly bonded with the second semiconductor element. For example, as explained above, respective bonding surfaces of first and second device dies can be prepared for bonding. The bonding surfaces may be polished, activated, and terminated with a desired species as explained herein. When the bonding surfaces are brought into contact (e.g., at room temperature), covalent bonds form between the two semiconductor elements without an intervening adhesive. In a block 98, the first semiconductor element can be removed from the film. For example, the plunger can be retracted, which may cause the film to pull away from the first semiconductor element due to the stronger chemical bonds between the two dies.

The stacked and bonded semiconductor elements (e.g., stacked and bonded dies) can be packaged in any suitable way for subsequent incorporation into a larger electronic device or system. For example, an encapsulant or molding material can be applied over at least part of a surface of the semiconductor elements and/or in gaps between adjacent semiconductor elements. The semiconductor elements can be singulated and mounted to a package substrate.

FIGS. 10A-10E illustrate yet another embodiment of systems and methods for the efficient transfer of semiconductor elements (e.g., integrated device dies) from a film 15, such as an adhesive film or tape, to a support structure 10 for packaging. Unless otherwise noted, reference numerals in FIGS. 10A-10E refer to components that are the same as or generally similar to like-numbered components of FIGS. 1-8L. Moreover, the features described in connection with FIGS. 10A-10E may be used in combination with any of the features described and illustrated in connection with the embodiments of FIGS. 1-9. In the embodiment of FIGS. 10A-10E, the die release assembly 24 comprises a pair of collets 110A, 110B that cooperate to hold or support two dies 16, 16B on respective films 15, 15B that are to be bonded together. In some embodiments, the collets 110A, 110B can cooperate to hold or support a single die that is to be placed on a support structure 10.

Turning to FIG. 10A, one or more dies 16 (which may comprise KGDs and potentially also bad dies, which can be identified in wafer-level testing) may be supported on the film 15, and one or more dies 16B (which may also comprise KGDs and potentially also bad dies) may be supported on the film 15B. The films 15, 15B can be oriented relative to one another such that bonding surfaces 56 of the dies 16 face corresponding bonding surfaces 56B (and support surfaces 11) of the dies 16B. In FIG. 10B, the die release assembly 24 can be activated to apply respective forces $F_1$, $F_2$ to a first collet 110A and a second collet 110B to cause the collets 110A, 110B to move towards one another along the z-axis. In some embodiments, one collet may remain stationary while the other collet is moved. Although not illustrated in FIG. 10B, the collets 110A, 110B can be controlled by a control system, which may be the same as or generally similar to the control system 100 disclosed herein. As shown in FIG. 10B, as the collets 110A, 110B move towards one another, the collets 110A, 110B can pierce the films 15, 15B around the periphery of the dies 16, 16B such that a portion of each collet 110A, 110B is disposed about the periphery of the dies 16, 16B to support the dies 16, 16B.

Figure 10E:
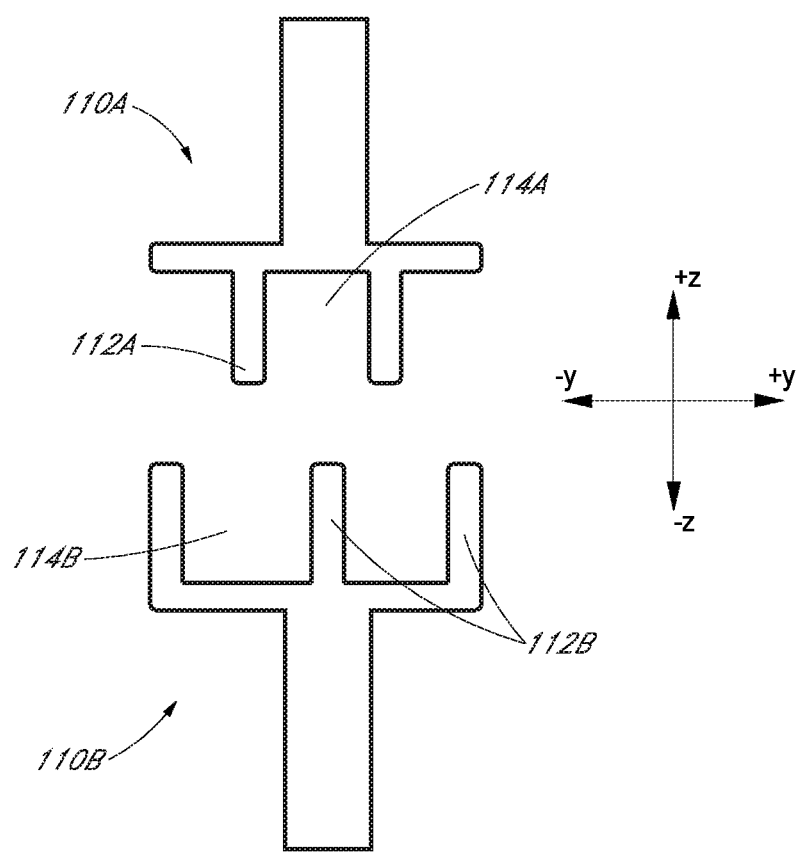
FIG. 10E is a schematic side view of the collets, according to various embodiments.

The collets 110A, 110B can comprise any suitable mechanism which holds and supports the dies 16, 16B for bonding to one another and/or for placement on the support structure 10. FIG. 10E is a schematic side view of exemplary collets 110A, 110B, according to some embodiments. In FIG. 10E, which is presented in the y-z plane, the first collet 110A can comprise a plurality of fingers 112A spaced apart by one or more corresponding gaps 114A. The second collet 110B can similarly comprise a plurality of fingers 112B spaced apart by one or more corresponding gaps 114B. As shown in FIG. 10E, the collets are oriented with respect to one another such that the fingers 112A of the first collet 110A can be staggered along the y-axis relative to the fingers 112B of the second collet 110B such that, when the collets 110A, 110B are brought together along the z-axis, the fingers 112A of the first collet are received in the gaps 114B of the second collet, and the fingers 112B of the second collet are received in the gaps 114A of the first collet. While only one side of the collets is shown in FIG. 10E, it will be understood that fingers can be similarly staggered on all four sides of the collets for surrounding rectangular dies. Staggering the fingers 112A, 112B relative to one another can advantageously enable the collets 110A, 110B to mate in order to hold and/or support the dies 16, 16B. In addition, when the collets 110A, 110B are brought together by application of the respective forces $F_1$, $F_2$, the fingers 112A, 112B can pierce the films 15, 15B so that the fingers 112A, 112B are disposed about the periphery of the dies 16, 16B, while still leaving the films 15, 15B continuous and intact but with perforations.

Returning to FIG. 10C, the collets 110A, 110B can be further brought together by application of the forces $F_1$, $F_2$ until the two dies 16, 16B contact and bond together, for example, by direct bonding using the processing techniques described herein. In the illustrated embodiment, the second collet 110B may remain stationary, or may move only slightly, and the first collet 110A may move along the −z axis, which can cause the film 14 to stretch or bend at a deformable portion 116 of the film 15. After direct bonding, a bond 113 can form at an interface between the two dies 16, 16B.

In FIG. 10D, the two collets 110A, 110B can be moved away from one another after bonding by application of respective forces $F_3$, $F_4$ to the collets 110A, 110B. In some embodiments, one collet (such as collet 110B) may remain stationary, and the other collet (e.g., collet 110A) may move away along the z-axis. When the collets 110A, 110B are separated from one another, one film 15 may release from the die 16, while the other die 16B remains attached to the other film 15B. For example, after direct bonding, the strength of the direct bond may exceed the adhesive strength between the die 16 and the film 15 such that, when the collets 110A, 110B are separated, the die 16 detaches from the film 15. In some arrangements, as explained above, a pre-release treatment (such as exposure to UV radiation) may be applied to the film 15 that is to be released.

Advantageously, the use of the collets 110A, 110B in FIGS. 10A-10E can provide a reliable mechanism for holding and supporting the dies 16, 16B before and during the bonding process. Moreover, the collets 110A, 110B can provide a simple alignment feature for accurately aligning the two dies prior to bonding, as machining and location of the fingers can supply sufficient mechanical alignment of the dies for bonding, possibly with the aid of inexpensive optical alignment with respect to one edge of a die. In some other arrangements, more sophisticated optical sensors (e.g., cameras) may be used to align markers on the dies 16, 16B to ensure that the dies 16, 16B are aligned before bonding. The collets 110A, 110B may provide a simpler solution than such more sophisticated optical sensors, since the collets 110A, 110B can be accurately machined to fit snugly around the periphery of the dies 16, 16B and to mate with one another to align the dies 16, 16B for bonding.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method for mounting elements on a support structure, the method comprising:
   receiving a plurality of singulated elements after a substrate has been singulated to define the plurality of singulated elements;
   providing a film;
   placing the plurality of singulated elements to be supported by the film, the plurality of singulated elements disposed adjacent one another along a surface of the film;
   positioning the film adjacent the support structure such that the surface of the film faces a support surface of the support structure, the support structure comprising a packaging structure;
   selectively positioning the film laterally relative to the support structure such that a selected first element is aligned with a first location of the support structure; and
   applying a force in a direction nonparallel to the surface of the film to cause the selected first element to be directly transferred from the film to the packaging structure, such that the first element is removed from the film.

2. The method of claim 1, further comprising singulating the substrate on the film to define the plurality of singulated elements.

3. The method of claim 1, wherein the plurality of singulated elements comprise a plurality of singulated integrated device dies, the method further comprising selecting a first known good die from the plurality of singulated integrated device dies, the first known good die having properly-functioning electrical characteristics, the selected first die comprising the first known good die.

4. The method of claim 1, further comprising adjusting the film or the support structure in a lateral direction parallel to the surface of the film to align the selected first element with the first location.

5. The method of claim 1, wherein the film comprises an adhesive sheet attached to a backside of the plurality of singulated elements and supported by a frame.

6. The method of claim 1, further comprising:
   selecting a second element from the plurality of singulated elements;
   repositioning the support structure laterally relative to the film such that the second element is aligned with a selected location on the support structure; and
   applying a second force to at least one of the support structure and the film in a direction nonparallel to the surface of the film to cause the selected second element to be transferred directly from the film to the packaging structure.

7. The method of claim 1, further comprising stacking at least some of the singulated elements onto another corresponding plurality of elements.

8. The method of claim 1, further comprising filling gaps between adjacent elements on the support structure with a filling material.

9. The method of claim 1, further comprising polishing a front side of the selected first element with the first element on the film, terminating the front side of the selected first element with a species with the first element on the film, and activating the front side of the selected first element with a species with the first element on the film.

10. The method of claim 9, further comprising directly bonding the selected first element to another element without an intervening adhesive.

11. A method for bonding elements, the method comprising:
providing a film which supports first plurality of singulated elements, the first plurality of singulated elements disposed adjacent one another along a first surface of the film;
providing a support structure which supports a second plurality of elements, the second plurality of elements disposed adjacent one another along a second surface of the support structure;
positioning the film adjacent the support structure such that a selected first element from the first plurality of singulated elements is aligned with and faces a second element from the second plurality of singulated elements;
applying a force in a direction nonparallel to the first surface of the film to cause the first element to contact the second element;
directly bonding the first element with the second element; and
removing the first element from the film.

12. The method of claim 11, wherein the first plurality of diced elements comprises a first plurality of diced integrated device dies, and wherein the second plurality of diced elements comprises a second plurality of diced integrated device dies.

13. The method of claim 11, further comprising singulating the second plurality of elements before applying the force and directly bonding.

14. The method of claim 11, wherein positioning the film comprises selectively positioning the film laterally relative to the support structure such that the selected first element is aligned with the second element.

15. The method of claim 12, further comprising performing electrical testing on at least one of the first and second pluralities of dies to identify known good dies having properly-functioning electrical characteristics.

16. The method of claim 11, further comprising polishing a first bonding surface of the first element and a second bonding surface of the second element with the first element on the film.

17. A method for mounting integrated device dies on a support structure, the method comprising:
receiving a plurality of singulated integrated device dies after a substrate has been singulated to define the plurality of singulated integrated device dies;
providing a film;
placing the plurality of singulated integrated device dies to be supported by the film, the plurality of singulated integrated device dies disposed adjacent one another along a surface of the film;
positioning the film adjacent the support structure such that the surface of the film faces a support surface of the support structure;
selecting a first known good die from the plurality of singulated integrated device dies, the first known good die having properly-functioning electrical characteristics;
selectively positioning the film laterally relative to the support structure such that the first known good die is aligned with a first location of the support structure;
applying a force in a direction nonparallel to the surface of the film to cause the selected first known good die to be directly transferred from the film to the support structure, such that the first known good die is removed from the film.

18. The method of claim 17, wherein the support structure comprises an element, the method further comprising directly bonding the first known good die to the element without an intervening adhesive.

19. The method of claim 1, wherein the film is wider than at least two singulated elements of the plurality of singulated elements.

20. The method of claim 11, wherein the film is wider than at least two singulated elements of the plurality of singulated elements.

21. The method of claim 17, wherein the film is wider than at least two singulated elements of the plurality of singulated elements.

22. A method for mounting a plurality of elements on a support structure, the method comprising:
receiving a plurality of singulated elements;
providing a film;
placing the plurality of singulated elements to be supported by the film, the plurality of singulated elements disposed adjacent one another along a surface of the film;
positioning the film adjacent the support structure such that the surface of the film faces a support surface of the support structure;
selectively positioning the film laterally relative to the support structure such that a selected first element is aligned with a first location of the support structure; and
applying a force in a direction nonparallel to the surface of the film to cause a selected first element to be directly transferred from the film to the support structure, such that the first element is removed from the film and directly bonded to the support structure without an intervening adhesive.

23. The method of claim 22, wherein the support structure comprises a wafer or wafer stack, a die or die stack, a reconstituted wafer, a panel, a reconstituted panel, a printed circuit board, an interposer, a glass substrate, a plastic substrate, a ceramic substrate, or package substrate.

* * * * *